(12) United States Patent
McAvoy et al.

(10) Patent No.: US 8,075,855 B2
(45) Date of Patent: *Dec. 13, 2011

(54) MEMS INTEGRATED CIRCUIT COMPRISING PERISTALTIC MICROFLUIDIC PUMP

(75) Inventors: Gregory John McAvoy, Balmain (AU); Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 785 days.

This patent is subject to a terminal disclaimer.

(21) Appl. No.: 12/142,780

(22) Filed: Jun. 20, 2008

(65) Prior Publication Data

US 2009/0317272 A1    Dec. 24, 2009

(51) Int. Cl.
    *F04B 43/12*    (2006.01)
(52) U.S. Cl. ........ 422/504; 422/509; 422/537; 417/474; 137/829; 436/180
(58) Field of Classification Search .................. None
    See application file for complete search history.

(56) References Cited

U.S. PATENT DOCUMENTS

| | | | |
|---|---|---|---|
| 4,909,710 | A | 3/1990 | Kaplan et al. |
| 6,117,643 | A | 9/2000 | Simpson et al. |
| 6,136,212 | A | 10/2000 | Mastrangelo et al. |
| 6,318,641 | B1 | 11/2001 | Knebel et al. |
| 6,612,110 | B1 | 9/2003 | Silverbrook |
| 6,632,400 | B1 | 10/2003 | Brennen et al. |
| 6,720,710 | B1 * | 4/2004 | Wenzel et al. ............. 310/328 |
| 6,818,395 | B1 | 11/2004 | Quake et al. |
| 6,905,834 | B1 | 6/2005 | Simpson et al. |
| 7,011,288 | B1 | 3/2006 | Slicker et al. |
| 7,090,992 | B2 | 8/2006 | Simpson et al. |
| 7,143,785 | B2 | 12/2006 | Maerkl et al. |
| 7,258,774 | B2 | 8/2007 | Chou et al. |
| 7,438,856 | B2 | 10/2008 | Jedrzejewski et al. |
| 7,650,910 | B2 | 1/2010 | Welle |
| 2002/0043638 | A1 | 4/2002 | Kao et al. |
| 2002/0127736 | A1 | 9/2002 | Chou et al. |
| 2002/0195579 | A1 | 12/2002 | Johnson |
| 2003/0150791 | A1 | 8/2003 | Cho et al. |
| 2004/0248167 | A1 | 12/2004 | Quake et al. |
| 2005/0175505 | A1 | 8/2005 | Cantor et al. |
| 2005/0238506 | A1 | 10/2005 | Mescher et al. |
| 2005/0257835 | A1 | 11/2005 | Midtgard et al. |
| 2006/0189022 | A1 * | 8/2006 | Vaiyapuri et al. ............. 438/50 |
| 2007/0034818 | A1 | 2/2007 | Grummon |
| 2007/0286739 | A1 | 12/2007 | Hsieh et al. |
| 2008/0129788 | A1 | 6/2008 | McAvoy et al. |
| 2008/0191303 | A1 | 8/2008 | Carlson et al. |
| 2009/0084946 | A1 | 4/2009 | Zhu et al. |

OTHER PUBLICATIONS

U.S. Appl. No. 11/763,440, filed Jun. 15, 2007, McAvoy.

(Continued)

*Primary Examiner* — In Suk Bullock
*Assistant Examiner* — Timothy G Kingan

(57) ABSTRACT

A MEMS integrated circuit comprising a peristaltic microfluidic pump and control circuitry for the pump. The pump comprises a pumping chamber positioned between an inlet and an outlet; a plurality of moveable fingers positioned in a wall of the pumping chamber, the fingers being arranged in a row along the wall; and a plurality of thermal bend actuators. Each actuator is associated with a respective finger such that actuation of the thermal bend actuator causes movement of the respective finger into the pumping chamber. The control circuitry controls actuation of the plurality of actuators. The control circuitry is configured to provide a peristaltic pumping action in each pumping chamber via peristaltic movement of the fingers.

20 Claims, 13 Drawing Sheets

OTHER PUBLICATIONS

U.S. Appl. No. 11/685,084, filed Mar. 12, 2007, McAvoy.
U.S. Appl. No. 11/740,925, filed Apr. 27, 2007, McAvoy.
U.S. Appl. No. 11/763,444, filed Jun. 15, 2007, McAvoy.
U.S. Appl. No. 11/946,840, filed Jan. 18, 2008, McAvoy.

* cited by examiner

MEMS INTEGRATED CIRCUIT COMPRISING PERISTALTIC MICROFLUIDIC PUMP

FIELD OF THE INVENTION

This invention relates to lab-on-a-chip (LOC) and microfluidics technology. It has been developed to provide fully integrated microfluidic systems (e.g. LOC devices), as well as microfluidic devices which do not rely solely on soft lithographic fabrication processes.

CO-PENDING APPLICATIONS

The following applications have been filed by the Applicant simultaneously with the present application:

| | | | | |
|---|---|---|---|---|
| 12/142,779 | 12/142,781 | 12/142,782 | 12/142,783 | 12/142,784 |
| 12/142,788 | 12/142,789 | 7,892,496 | 7,887,756 | 7,842,248 |
| 12/142,793 | 12/142,794 | | | |

The disclosures of these co-pending applications are incorporated herein by reference.

CROSS REFERENCES

The following patents or patent applications filed by the applicant or assignee of the present invention are hereby incorporated by cross-reference.

| | | | | | | |
|---|---|---|---|---|---|---|
| 7,344,226 | 7,328,976 | 11/685,084 | 11/685,086 | 11/685,090 | 11/740,925 | 11/763,444 |
| 11/763,443 | 11/946,840 | 11/961,712 | 12/017,771 | 11/763,440 | 11/763,442 | 12/114,826 |
| 12/114,827 | | | | | | |

BACKGROUND OF THE INVENTION

"Lab-on-a-chip" (LOC) is a term describing devices of only a few square millimeters or centimeters, which are able to perform a myriad of tasks normally associated with a standard laboratory. LOC devices comprise microfluidic channels, which and are capable of handling very small fluid volumes in the nanoliter or picoliter range. The applicability of LOC devices for chemical and biological analysis has fuelled research in this field, especially if LOC devices can be fabricated cheaply enough to provide disposable biological analysis tools. For example, one of the goals of LOC technology is to provide real-time DNA detection devices, which can be used once and then disposed of.

Fabrication of LOC devices evolved from standard MEMS technology, whereby well-established photolithographic techniques are used for fabricating devices on silicon wafers. Fluidic control is crucial for most LOC devices. Accordingly, LOC devices typically comprise an array of individually controllable microfluidics devices, such as valves and pumps. Although LOC devices originally evolved from silicon-based MEMS technology, more recently there has been general shift towards soft lithography, which employs elastomeric materials. Elastomers are far more suitable than silicon for forming effective valve seals. Thus, polydimethylsiloxane (PDMS) has now become the material of choice for fabricating microfluidics devices in LOC chips. A PDMS microfluidics platform is typically fabricated using soft lithography and then mounted on a glass substrate.

One of the most common types of valve employed in LOC devices is the 'Quake' valve, as described in U.S. Pat. No. 7,258,774, the contents of which is incorporated herein by reference. The 'Quake' valve uses fluidic pressure (e.g. pneumatic pressure or hydraulic pressure) in a control channel to collapse a PDMS wall of an adjacent fluid flow channel, in the manner of a conventional pneumatic pinch valve. Referring briefly to FIGS. 1A-C, the Quake valve comprises a fluid flow channel 1 and control channel 2, which extends transversely across the fluid flow channel 1. A membrane 3 separates the channels 1 and 2. The channels 1 and 2 are defined in a flexible elastomeric substrate, such as PDMS, using soft lithography so as to provide a microfluidic structure 4. The microfluidic structure 4 is bonded to a planar substrate 5, such as a glass slide.

As shown in FIG. 1B, the fluid flow channel 1 is "open". In FIG. 1C, pressurization of the control channel 2 (either by gas or liquid introduced therein by an external pump) causes the membrane 3 to deflect downwards, thereby pinching the fluid flow channel 1 and controlling a flow of fluid through the channel 1. Accordingly, by varying the pressure in control channel 2, a linearly actuable valving system is provided such that fluid flow channel 1 can be opened or closed by moving membrane 3 as desired. (For illustration purposes only, the fluid flow channel 1 in FIG. 1C is shown in a "mostly closed" position, rather than a "fully closed" position).

A plurality of Quake valves may cooperate to provide a peristaltic pump. Hence, the 'Quake' valving system has been used to create thousands of valves and pumps in one LOC device. As foreshadowed above, the number of potential chemical and biological applications of such devices is vast, ranging from fuel cells to DNA sequencers.

However, current microfluidics devices, such as those described in U.S. Pat. No. 7,258,774, suffer from a number of problems. In particular, these prior art microfluidics devices must be plugged into external control systems, air/vacuum systems and/or pumping systems in order to function. Whilst the microfluidics platform formed by soft lithography may be small and cheap to manufacture, the external support systems required to drive the microfluidics devices means that the resulting µTAS device is relatively expensive and much larger than the actual microfluidics platform. Hence, current technology is still unable to provide fully integrated, disposable LOC or µTAS devices. It would be desirable to provide a fully integrated LOC device, which does not require a plethora of external support systems to drive the device.

SUMMARY OF THE INVENTION

In a first aspect the present invention provides a peristaltic microfluidic pump comprising:
  a pumping chamber positioned between an inlet and an outlet;
  a plurality of moveable fingers positioned in a wall of said pumping chamber, said fingers being arranged in a row along said wall; and
  a plurality of thermal bend actuators, each actuator being associated with a respective finger such that actuation of said thermal bend actuator causes movement of said respective finger into said pumping chamber, wherein said pump is configured to provide a peristaltic pumping action in said pumping chamber via movement of said fingers.

Optionally, the pumping chamber is elongate, and said fingers are arranged in a row along a longitudinal wall of said pumping chamber.

Optionally, each finger extends transversely across said chamber.

Optionally, said fingers are arranged in opposed pairs of fingers, each finger in an opposed pair pointing towards a central longitudinal axis of said pumping chamber.

Optionally, each finger comprises said thermal bend actuator.

Optionally, said pumping chamber comprises a roof spaced apart from a substrate, and sidewalls extending between said roof and a floor defined by said substrate.

Optionally, said fingers are positioned in said roof.

Optionally, each thermal bend actuator comprises:
an active beam comprised of a thermoelastic material; and
a passive beam mechanically cooperating with said active beam, such that when a current is passed through the active beam, the active beam heats and expands relative to the passive beam, resulting in bending of the actuator.

Optionally, an extent of each finger is defined by said passive beam.

Optionally, said active beam is fused to said passive beam.

Optionally, said active beam defines a bent current path extending between a pair of electrodes, said electrodes being connected to control circuitry for controlling each actuator.

Optionally, said thermoelastic material is selected from the group comprising: titanium nitride, titanium aluminium nitride and vanadium-aluminium alloys.

Optionally, said passive beam is comprised of a material selected from the group comprising: silicon oxide, silicon nitride and silicon oxynitride.

Optionally, said substrate comprises control circuitry for controlling each actuator.

Optionally, said substrate is a silicon substrate having said control circuitry contained in at least one CMOS layer thereof.

Optionally, said wall is covered with a polymeric layer, said polymeric layer providing a mechanical seal between each finger and said wall.

Optionally, said polymeric layer is comprised of polydimethylsiloxane (PDMS).

Optionally, said inlet is defined in said substrate.

In a further aspect there is provided a microfluidic system comprising the microfluidic pump comprising:
a pumping chamber positioned between an inlet and an outlet;
a plurality of moveable fingers positioned in a wall of said pumping chamber, said fingers being arranged in a row along said wall; and
a plurality of thermal bend actuators, each actuator being associated with a respective finger such that actuation of said thermal bend actuator causes movement of said respective finger into said pumping chamber,
wherein said pump is configured to provide a peristaltic pumping action in said pumping chamber via movement of said fingers.

In another aspect there is provided a microfluidic system comprising the microfluidic pump comprising:
a pumping chamber positioned between an inlet and an outlet;
a plurality of moveable fingers positioned in a wall of said pumping chamber, said fingers being arranged in a row along said wall; and
a plurality of thermal bend actuators, each actuator being associated with a respective finger such that actuation of said thermal bend actuator causes movement of said respective finger into said pumping chamber,
wherein said pump is configured to provide a peristaltic pumping action in said pumping chamber via movement of said fingers,
which is a LOC device or a Micro Total Analysis System.

In a second aspect the present invention provides a MEMS integrated circuit comprising one or more peristaltic microfluidic pumps and control circuitry for said one or more pumps, each pump comprising:
a pumping chamber positioned between an inlet and an outlet;
a plurality of moveable fingers positioned in a wall of said pumping chamber, said fingers being arranged in a row along said wall; and
a plurality of thermal bend actuators, each actuator being associated with a respective finger such that actuation of said thermal bend actuator causes movement of said respective finger into said pumping chamber,
wherein said control circuitry controls actuation of said plurality of actuators, and said control circuitry is configured to provide a peristaltic pumping action in each pumping chamber via peristaltic movement of said fingers.

Optionally, the pumping chamber is elongate, and said fingers are arranged in a row along a longitudinal wall of said pumping chamber.

Optionally, each finger extends transversely across said chamber.

Optionally, said fingers are arranged in opposed pairs of fingers, each finger in an opposed pair pointing towards a central longitudinal axis of said pumping chamber.

Optionally, each finger comprises said thermal bend actuator.

Optionally, said pumping chamber comprises a roof spaced apart from a substrate, and sidewalls extending between said roof and a floor defined by said substrate.

Optionally, said fingers are positioned in said roof.

Optionally, each thermal bend actuator comprises:
an active beam comprised of a thermoelastic material; and
a passive beam mechanically cooperating with said active beam, such that when a current is passed through the active beam, the active beam heats and expands relative to the passive beam, resulting in bending of the actuator.

Optionally, an extent of each finger is defined by said passive beam.

Optionally, said active beam is fused to said passive beam.

Optionally, said active beam defines a bent current path extending between a pair of electrodes, said electrodes being connected to said control circuitry.

Optionally, said thermoelastic material is selected from the group comprising: titanium nitride, titanium aluminium nitride and vanadium-aluminium alloys.

Optionally, said passive beam is comprised of a material selected from the group comprising: silicon oxide, silicon nitride and silicon oxynitride.

Optionally, said substrate is a silicon substrate having said control circuitry contained in at least one CMOS layer thereof.

Optionally, said wall is covered with a polymeric layer, said polymeric layer providing a mechanical seal between each finger and said wall.

Optionally, said polymeric layer is comprised of polydimethylsiloxane (PDMS).

Optionally, said polymeric layer defines an exterior surface of said MEMS integrated circuit.

Optionally, said outlet is defined in said exterior surface.

Optionally, said inlet is defined in said substrate.

In another aspect there is provided a microfluidic system comprising the MEMS integrated circuit comprising one or more peristaltic microfluidic pumps and control circuitry for said one or more pumps, each pump comprising:
- a pumping chamber positioned between an inlet and an outlet;
- a plurality of moveable fingers positioned in a wall of said pumping chamber, said fingers being arranged in a row along said wall; and
- a plurality of thermal bend actuators, each actuator being associated with a respective finger such that actuation of said thermal bend actuator causes movement of said respective finger into said pumping chamber, wherein said control circuitry controls actuation of said plurality of actuators, and said control circuitry is configured to provide a peristaltic pumping action in each pumping chamber via peristaltic movement of said fingers.

In a third aspect the present invention provides a mechanically-actuated microfluidic valve comprising:
- an inlet port;
- an outlet port;
- a thermal bend actuator; and
- a valve closure member cooperating with said actuator, such that actuation of said thermal bend actuator causes movement of said closure member, thereby regulating a flow of fluid from said inlet port to said outlet port.

Optionally, said thermal bend actuator comprises:
- an active beam comprised of a thermoelastic material; and
- a passive beam mechanically cooperating with said active beam, such that when a current is passed through the active beam, the active beam heats and expands relative to the passive beam, resulting in bending of the actuator.

Optionally, said active beam is fused to said passive beam.

Optionally, said active beam defines a bent current path extending between a pair of electrodes, said electrodes being connected to control circuitry for controlling said actuator.

Optionally, said thermoelastic material is selected from the group comprising: titanium nitride, titanium aluminium nitride and vanadium-aluminium alloys.

Optionally, said passive beam is comprised of a material selected from the group comprising: silicon oxide, silicon nitride and silicon oxynitride.

Optionally, at least said actuator is defined in a MEMS layer of a silicon substrate.

Optionally, said substrate comprises control circuitry for controlling said actuator, said control circuitry being contained in at least one CMOS layer of said substrate.

Optionally, said inlet port and said outlet port are defined in a MEMS layer of a silicon substrate.

Optionally, said inlet port and said outlet port are defined in polymeric microfluidics platform.

Optionally, said closure member is comprised of a compliant material for sealing engagement with a sealing surface of said valve.

Optionally, said closure member is comprised of an elastomer.

Optionally, said closure member is comprised of polydimethylsiloxane (PDMS).

Optionally, said closure member is fused or bonded to said thermal bend actuator.

Optionally, said actuation causes open or closing of said valve.

Optionally, said actuation causes partial opening or partial closing of said valve.

In a fourth aspect the present invention provides a microfluidic system comprising a MEMS integrated circuit bonded to a polymeric microfluidics platform, said system comprising one or more microfluidic devices, wherein at least one of said microfluidic devices comprises a MEMS actuator positioned in a MEMS layer of said integrated circuit.

Optionally, said microfluidic devices are selected from the group comprising: microfluidic valves and microfluidic pumps.

Optionally, all of said microfluidic devices comprise a MEMS actuator positioned in said MEMS layer.

Optionally, said MEMS layer further comprises a microheater for heating a fluid in a microfluidic channel.

Optionally, said MEMS integrated circuit comprises a silicon substrate and said MEMS layer is formed on said substrate.

Optionally, said MEMS layer is covered with a polymeric layer.

Optionally, said polymeric layer defines a bonding surface of said MEMS integrated circuit.

Optionally, said polymeric layer is comprised of photopatternable PDMS.

Optionally, said microfluidics platform comprises a polymeric body having one or more microfluidic channels defined therein.

Optionally, said polymeric body is comprised of PDMS.

Optionally, at least one of said microfluidic channels is in fluid communication with said at least one microfluidic device.

Optionally, said MEMS integrated circuit comprises control circuitry for controlling said actuator, said control circuitry being contained in at least one CMOS layer of said substrate.

Optionally, said MEMS actuator is a thermal bend actuator.

Optionally, said thermal bend actuator comprises:
- an active beam comprised of a thermoelastic material; and
- a passive beam mechanically cooperating with said active beam, such that when a current is passed through the active beam, the active beam heats and expands relative to the passive beam, resulting in bending of the actuator.

Optionally, said active beam is fused to said passive beam.

Optionally, said active beam defines a bent current path extending between a pair of electrodes, said electrodes being connected to control circuitry for controlling said actuator.

Optionally, said thermoelastic material is selected from the group comprising: titanium nitride, titanium aluminium nitride and vanadium-aluminium alloys.

Optionally, said passive beam is comprised of a material selected from the group comprising: silicon oxide, silicon nitride and silicon oxynitride.

In a further aspect there is provided a microfluidic system comprising a MEMS integrated circuit bonded to a polymeric microfluidics platform, said system comprising one or more microfluidic devices, wherein at least one of said microfluidic devices comprises a MEMS actuator positioned in a MEMS layer of said integrated circuit, which is a LOC device or a Micro Total Analysis System (µTAS).

In a fifth aspect the present invention provides a microfluidic system comprising an integrated circuit having a bonding surface bonded to a polymeric microfluidics platform, said microfluidic system comprising one or more microfluidics devices controlled by control circuitry in said integrated circuit, wherein at least one of said microfluidic devices comprises a MEMS actuator positioned in a MEMS layer of said integrated circuit, said MEMS layer being covered with a polymeric layer which defines said bonding surface of said integrated circuit.

Optionally, said microfluidic devices are selected from the group comprising: microfluidic valves and microfluidic pumps.

Optionally, said microfluidic devices are positioned in any one of:
said integrated circuit;
said microfluidics platform; and
an interface between said integrated circuit and said microfluidics platform.

Optionally, said integrated circuit comprises a silicon substrate having at least one CMOS layer, and said control circuitry is contained in said at least one CMOS layer.

Optionally, said integrated circuit comprises a silicon substrate and said MEMS layer is formed on said substrate.

Optionally, said polymeric layer is comprised of photopatternable PDMS.

Optionally, said microfluidics platform comprises a polymeric body having one or more microfluidic channels defined therein.

Optionally, said polymeric body is comprised of PDMS.

Optionally, at least one of said microfluidic channels is in fluid communication with at least one said microfluidic devices.

Optionally, said MEMS actuator is a thermal bend actuator.
Optionally, said thermal bend actuator comprises:
an active beam comprised of a thermoelastic material; and
a passive beam mechanically cooperating with said active beam, such that when a current is passed through the active beam, the active beam heats and expands relative to the passive beam, resulting in bending of the actuator.

Optionally, said active beam is fused to said passive beam.
Optionally, said active beam defines a bent current path extending between a pair of electrodes, said electrodes being connected to said control circuitry for controlling said actuator.

Optionally, said thermoelastic material is selected from the group comprising: titanium nitride, titanium aluminium nitride and vanadium-aluminium alloys.

Optionally, said passive beam is comprised of a material selected from the group comprising: silicon oxide, silicon nitride and silicon oxynitride.

Optionally, said integrated circuit is in fluidic communication and/or mechanical communication with said polymeric microfluidics platform.

In another aspect there is provided a microfluidic system comprising an integrated circuit having a bonding surface bonded to a polymeric microfluidics platform, said microfluidic system comprising one or more microfluidics devices controlled by control circuitry in said integrated circuit,
wherein at least one of said microfluidic devices comprises a MEMS actuator positioned in a MEMS layer of said integrated circuit, said MEMS layer being covered with a polymeric layer which defines said bonding surface of said integrated circuit,
which is a LOC device or a Micro Total Analysis System (μTAS).

In a sixth aspect the present invention provides a microfluidic system comprising a MEMS integrated circuit, said MEMS integrated circuit comprising:
a silicon substrate having one or more microfluidic channels defined therein;
at least one layer of control circuitry for controlling one or more microfluidic devices;
a MEMS layer comprising said one or more microfluidic devices; and
a polymeric layer covering said MEMS layer,
wherein at least part of said polymeric layer provides a seal for at least one of said microfluidic devices.

Optionally, said MEMS integrated circuit contains all the microfluidic devices and control circuitry required for operation of said microfluidic system.

Optionally, said microfluidic devices are selected from the group comprising: microfluidic valves and microfluidic pumps.

Optionally, said control circuitry is contained in at least one CMOS layer.

Optionally, said polymeric layer is comprised of photopatternable PDMS.

Optionally, said polymeric layer defines an exterior surface of said MEMS integrated circuit.

Optionally, MEMS integrated circuit is mounted on a passive substrate via said polymeric layer.

Optionally, said at least one microfluidic device comprises a MEMS actuator.
Optionally, said MEMS actuator is a thermal bend actuator.
Optionally, said thermal bend actuator comprises:
an active beam comprised of a thermoelastic material; and
a passive beam mechanically cooperating with said active beam, such that when a current is passed through the active beam, the active beam heats and expands relative to the passive beam, resulting in bending of the actuator.

Optionally, said active beam is fused to said passive beam.
Optionally, said active beam defines a bent current path extending between a pair of electrodes, said electrodes being connected to said control circuitry for controlling said actuator.

Optionally, said thermoelastic material is selected from the group comprising: titanium nitride, titanium aluminium nitride and vanadium-aluminium alloys.

Optionally, said passive beam is comprised of a material selected from the group comprising: silicon oxide, silicon nitride and silicon oxynitride.

Optionally, said microfluidic device is a microfluidic valve comprising a sealing surface positioned between an inlet port and an outlet ports, and wherein said at least part of said polymeric layer is configured for sealing engagement with said sealing surface.

Optionally, said sealing engagement regulates fluid flow from said inlet port to said outlet port.

Optionally, said microfluidic device is a microfluidic peristaltic pump comprising:
a pumping chamber positioned between an inlet and an outlet; and
a plurality of moveable fingers positioned in a wall of said pumping chamber, said fingers being arranged in a row along said wall and configured to provide a peristaltic pumping action via movement of said fingers,
wherein said at least part of said polymeric layer provides a mechanical seal between each moveable finger and said wall.

In a further aspect there is provided a microfluidic system comprising a MEMS integrated circuit, said MEMS integrated circuit comprising:
a silicon substrate having one or more microfluidic channels defined therein;
at least one layer of control circuitry for controlling one or more microfluidic devices;
a MEMS layer comprising said one or more microfluidic devices; and
a polymeric layer covering said MEMS layer, wherein at least part of said polymeric layer provides a seal for at least one of said microfluidic devices,
which is a LOC device Micro Total Analysis System (µTAS).

In a seventh aspect the present invention provides a microfluidic valve comprising:
an inlet port;
an outlet port;
a weir positioned between said inlet and outlet ports, said weir having a sealing surface;
a diaphragm membrane for sealing engagement with said sealing surface; and
at least one thermal bend actuator for moving said diaphragm membrane between a closed position in which said membrane is sealingly engaged with said sealing surface and an open position in which said membrane is disengaged from said sealing surface.

Optionally, in said open position, a connecting channel is defined between said diaphragm membrane and said sealing surface, said connecting channel providing fluidic communication between said inlet and outlet ports.

Optionally, said open position includes a fully open position and a partially open position.

Optionally, said diaphragm membrane is fused or bonded to at least one moveable finger, said actuator causing movement of said finger.

Optionally, said at least one finger comprises said thermal bend actuator.

Optionally, the microfluidic valve according to the present invention comprising a pair of opposed fingers, each of said fingers pointing towards said weir, wherein said diaphragm membrane bridges between said opposed fingers.

Optionally, said valve is formed on a substrate, said diaphragm membrane and said fingers being spaced apart from said substrate, and said weir extending from said substrate towards said diaphragm membrane.

Optionally, said weir is positioned centrally between said opposed fingers.

Optionally, each of said fingers comprises a respective thermal bend actuator.

Optionally, each thermal bend actuator comprises:
an active beam comprised of a thermoelastic material; and
a passive beam mechanically cooperating with said active beam, such that when a current is passed through the active beam, the active beam heats and expands relative to the passive beam, resulting in bending of the actuator.

Optionally, an extent of each finger is defined by said passive beam.

Optionally, said active beam is fused to said passive beam.

Optionally, said active beam defines a bent current path extending between a pair of electrodes, said electrodes being connected to control circuitry for controlling each actuator.

Optionally, said thermoelastic material is selected from the group comprising: titanium nitride, titanium aluminium nitride and vanadium-aluminium alloys.

Optionally, said passive beam is comprised of a material selected from the group comprising: silicon oxide, silicon nitride and silicon oxynitride.

Optionally, said substrate comprises control circuitry for controlling said at least one actuator.

Optionally, said substrate is a silicon substrate having said control circuitry contained in at least one CMOS layer thereof.

Optionally, said diaphragm membrane is defined by at least part of a polymeric layer.

Optionally, said polymeric layer is comprised of polydimethylsiloxane (PDMS).

Optionally, a plurality of the microfluidic valves according to the present invention are arranged in series for use in peristaltic pump.

In an eighth aspect the present invention provides a MEMS integrated circuit comprising one or more microfluidic diaphragm valves and control circuitry for said one or more valves, each valve comprising:
an inlet port;
an outlet port;
a weir positioned between said inlet and outlet ports, said weir having a sealing surface;
a diaphragm membrane for sealing engagement with said sealing surface; and
at least one thermal bend actuator for moving said diaphragm membrane between a closed position in which said membrane is sealingly engaged with said sealing surface and an open position in which said membrane is disengaged from said sealing surface,
wherein said control circuitry is configured to control actuation of said at least one actuator so as to control opening and closing of said valve.

Optionally, in said open position, a connecting channel is defined between said diaphraphm membrane and said sealing surface, said connecting channel providing fluidic communication between said inlet and outlet ports.

Optionally, said open position includes a fully open position and a partially open position, a degree of opening being controlled by said control circuitry.

Optionally, said diaphragm membrane is fused or bonded to at least one moveable finger, said actuator causing movement of said finger.

Optionally, said at least one finger comprises said thermal bend actuator.

Optionally, the MEMS integrated circuit according to the present invention comprising a pair of opposed fingers, each of said fingers pointing towards said weir, wherein said diaphragm membrane bridges between said opposed fingers.

Optionally, said valve is formed on a substrate, said diaphragm membrane and said fingers being spaced apart from said substrate, and said weir extending from said substrate towards said diaphragm membrane.

Optionally, said weir is positioned centrally between said opposed fingers.

Optionally, each of said fingers comprises a respective thermal bend actuator.

Optionally, each thermal bend actuator comprises:
an active beam comprised of a thermoelastic material; and
a passive beam mechanically cooperating with said active beam, such that when a current is passed through the active beam, the active beam heats and expands relative to the passive beam, resulting in bending of the actuator.

Optionally, an extent of each finger is defined by said passive beam.

Optionally, said active beam is fused to said passive beam.

Optionally, said active beam defines a bent current path extending between a pair of electrodes, said electrodes being connected to control circuitry for controlling each actuator.

Optionally, said thermoelastic material is selected from the group comprising: titanium nitride, titanium aluminium nitride and vanadium-aluminium alloys.

Optionally, said passive beam is comprised of a material selected from the group comprising: silicon oxide, silicon nitride and silicon oxynitride.

Optionally, said substrate is a silicon substrate having said control circuitry contained in at least one CMOS layer thereof.

Optionally, said diaphragm membrane is defined by at least part of a polymeric layer.

Optionally, said polymeric layer is comprised of polydimethylsiloxane (PDMS).

Optionally, said polymeric layer defines an exterior surface of said MEMS integrated circuit.

Optionally, a plurality of said valves are arranged in series and said control circuitry is configured to control actuation of each actuator so as to provide a peristaltic pumping action. In a ninth aspect the present invention provides a microfluidic pinch valve comprising:
- a microfluidic channel defined in a compliant body;
- a valve sleeve defined by a section of said microfluidic channel, said valve sleeve having a membrane wall defining at least part of an outer surface of said body;
- a compression member for pinching said membrane wall against an opposed wall of said valve sleeve; and
- a thermal bend actuator for moving said compression member between a closed position in which said membrane wall is sealingly pinched against said opposed wall, and an open position in which said membrane wall is disengaged from said opposed wall.

Optionally, said open position includes a fully open position and a partially open position.

Optionally, a moveable finger is engaged with said compression member, said finger being configured to urge said compression member between said open and closed positions via movement of said actuator.

Optionally, said compression member is sandwiched between said finger and said membrane wall.

Optionally, said compression member protrudes from said membrane wall.

Optionally, said compression member is biased towards said closed position when said thermal bend actuator is in a quiescent state.

Optionally, a MEMS integrated circuit is bonded to said outer surface of said body, said moveable finger being contained in a MEMS layer of said integrated circuit.

Optionally, said MEMS integrated circuit comprises a bonding surface defined by a polymeric layer, said bonding surface being bonded to said outer surface of said body.

Optionally, said polymeric layer covers said MEMS layer.

Optionally, said polymeric layer and/or said compliant body are comprised of PDMS.

Optionally, actuation of said actuator causes said finger to move away from said body, thereby opening said valve; and
deactuation of said actuator causes said finger to move towards said body, thereby closing said valve.

Optionally, said moveable finger comprises said thermal bend actuator.

Optionally, said thermal bend actuator comprises:
an active beam comprised of a thermoelastic material; and
a passive beam mechanically cooperating with said active beam, such that when a current is passed through the active beam, the active beam heats and expands relative to the passive beam, resulting in bending of the actuator.

Optionally, an extent of said finger is defined by said passive beam.

Optionally, said active beam is fused to said passive beam.

Optionally, said active beam defines a bent current path extending between a pair of electrodes, said electrodes being connected to control circuitry for controlling each actuator.

Optionally, said thermoelastic material is selected from the group comprising: titanium nitride, titanium aluminium nitride and vanadium-aluminium alloys; and said passive beam is comprised of a material selected from the group comprising: silicon oxide, silicon nitride and silicon oxynitride.

Optionally, said MEMS integrated circuit comprises a silicon substrate having control circuitry contained in at least one CMOS layer.

Optionally, there is provided a microfluidic system comprising the microfluidic valve according to the present invention.

Optionally, the microfluidic system according to the present invention comprising a plurality of said valves arranged in series.

In a tenth aspect the present invention provides a microfluidic system comprising:
(A) a microfluidics platform comprising:
- a compliant body having a microfluidic channel defined therein;
- a valve sleeve defined by a section of said microfluidic channel, said valve sleeve having a membrane wall defining at least part of an outer surface of said body; and
- a compression member for pinching said membrane wall against an opposed wall of said valve sleeve; and (B) a MEMS integrated circuit bonded to said outer surface of said body, said MEMS integrated circuit comprising:
- a moveable finger engaged with said compression member, said finger being configured to urge said compression member between a closed position in which said membrane wall is sealingly pinched against said opposed wall, and an open position in which said membrane wall is disengaged from said opposed wall;
- a thermal bend actuator associated with said finger, said actuator configured for controlling movement of said finger; and
- control circuitry for controlling actuation of said actuator so as to control opening and closing of said valve sleeve.

Optionally, said open position includes a fully open position and a partially open position.

Optionally, said compression member is sandwiched between said finger and said membrane wall.

Optionally, said compression member protrudes from said membrane wall.

Optionally, said compression member is part of said membrane wall.

Optionally, said compression member is biased towards said closed position when said thermal bend actuator is in a quiescent state.

Optionally, said MEMS integrated circuit comprises a bonding surface defined by a polymeric layer, said bonding surface being bonded to said outer surface of said body.

Optionally, said polymeric layer covers a MEMS layer containing said moveable finger.

Optionally, said polymeric layer and/or said compliant body are comprised of PDMS.

Optionally, actuation of said actuator causes said finger to move away from said body, thereby opening said valve sleeve; and
deactuation of said actuator causes said finger to move towards said body, thereby closing said valve sleeve.

Optionally, said moveable finger comprises said thermal bend actuator.

Optionally, said thermal bend actuator comprises:
an active beam comprised of a thermoelastic material; and
a passive beam mechanically cooperating with said active beam, such that when a current is passed through the active beam, the active beam heats and expands relative to the passive beam, resulting in bending of the actuator.

Optionally, an extent of said finger is defined by said passive beam.

Optionally, said active beam is fused to said passive beam.

Optionally, said active beam defines a bent current path extending between a pair of electrodes, said electrodes being connected to said control circuitry.

Optionally, said thermoelastic material is selected from the group comprising: titanium nitride, titanium aluminium nitride and vanadium-aluminium alloys.

Optionally, said passive beam is comprised of a material selected from the group comprising: silicon oxide, silicon nitride and silicon oxynitride.

Optionally, said MEMS integrated circuit comprises a silicon substrate having said control circuitry contained in at least one CMOS layer.

In an eleventh aspect the present invention provides a microfluidic system comprising:

(A) a microfluidics platform comprising:
- a compliant body having a microfluidic channel defined therein;
- an elongate chamber defined by a section of said microfluidic channel, said chamber having a membrane wall defining at least part of an outer surface of said body; and
- a plurality of compression members spaced apart along said membrane wall, each compression member being configured for pinching a respective part of said membrane wall against an opposed wall of said chamber; and (B) a MEMS integrated circuit bonded to said outer surface of said body, said MEMS integrated circuit comprising:
- a plurality of moveable fingers, each finger engaged with a respective compression member, each finger being configured to urge said respective compression member between a closed position in which said respective part of said membrane wall is sealingly pinched against said opposed wall, and an open position in which said respective part of said membrane wall is disengaged from said opposed wall;
- a plurality of thermal bend actuators, each associated with a respective finger for controlling movement of said respective finger, and
- control circuitry for controlling actuation of said actuators.

Optionally, said control circuitry is configured to provide one or more of:
(i) a peristaltic pumping action in said chamber via peristaltic movement of said fingers;
(ii) a mixing action in said chamber via movement of said fingers;
(iii) a concerted valving action in said chamber.

Optionally, said mixing action generates a turbulent flow of fluid through said chamber.

Optionally, said concerted valving action concertedly moves all said compression members into either an open position or a closed position.

Optionally, said control circuitry is configured to provide interchangeably two or more of said peristaltic pumping action, said mixing action and said concerted valving action.

Optionally, each compression member is sandwiched between its respective finger and said membrane wall.

Optionally, each compression member protrudes from said membrane wall.

Optionally, each compression member is part of said membrane wall.

Optionally, each compression member is biased towards said closed position when said thermal bend actuator is in a quiescent state.

Optionally, said MEMS integrated circuit comprises a bonding surface defined by a polymeric layer, said bonding surface being bonded to said outer surface of said body.

Optionally, said polymeric layer covers a MEMS layer containing said moveable finger.

Optionally, said polymeric layer and/or said compliant body are comprised of PDMS.

Optionally, actuation of each actuator causes its respective finger to move away from said body, thereby disengaging a respective part of said membrane wall from said opposed wall; and deactuation of each actuator causes said respective finger to move towards said body, thereby sealingly pinching a respective part of said membrane wall against said opposed wall.

Optionally, each moveable finger comprises said thermal bend actuator.

Optionally, each thermal bend actuator comprises:
an active beam comprised of a thermoelastic material; and
a passive beam mechanically cooperating with said active beam, such that when a current is passed through the active beam, the active beam heats and expands relative to the passive beam, resulting in bending of the actuator.

Optionally, an extent of each finger is defined by said passive beam.

Optionally, said active beam is fused to said passive beam.

Optionally, said active beam defines a bent current path extending between a pair of electrodes, said electrodes being connected to said control circuitry.

Optionally, said thermoelastic material is selected from the group comprising: titanium nitride, titanium aluminium nitride and vanadium-aluminium alloys; and said passive beam is comprised of a material selected from the group comprising: silicon oxide, silicon nitride and silicon oxynitride.

Optionally, said MEMS integrated circuit comprises a silicon substrate having said control circuitry contained in at least one CMOS layer.

In a twelfth aspect the present invention provides a microfluidic system comprising a MEMS integrated circuit bonded to a microfluidics platform, said microfluidics platform comprising a polymeric body having at least one microfluidic channel defined therein, and said MEMS integrated circuit comprising at least one thermal bend actuator, wherein said microfluidic system is configured such that movement of said at least one actuator causes closure of said channel.

Optionally, said at least one thermal bend actuator is associated with a respective moveable finger such that actuation of said thermal bend actuator causes movement of said respective finger.

Optionally, said finger is engaged with a wall of said microfluidic channel.

Optionally a microfluidic system according to the present invention which is configured such that movement of said finger towards said microfluidics platform causes closure of said channel by pinching said wall against an opposed wall.

Optionally, said movement is provided by deactuation of said thermal bend actuator.

Optionally a microfluidic system according to the present invention comprising a plurality of moveable fingers configured as a linear peristaltic pump.

Optionally, said pump is in fluidic communication with a control channel defined in said polymeric body, said control channel cooperating with said microfluidic channel such that pressurizing said control channel with a control fluid causes pinching closure of said microfluidic channel.

Optionally, said control fluid is a gas providing pneumatic control, or a liquid providing hydraulic control.

Optionally, said at least one thermal bend actuator is positioned in a MEMS layer of said MEMS integrated circuit.

Optionally, said MEMS integrated circuit comprises a silicon substrate and said MEMS layer is formed on said substrate.

Optionally, said MEMS integrated circuit comprises control circuitry for controlling said at least one thermal bend actuator, said control circuitry being contained in at least one CMOS layer of said substrate.

Optionally, said MEMS layer is covered with a polymeric layer.

Optionally, said polymeric layer defines a bonding surface of said MEMS integrated circuit.

Optionally, said polymeric layer is comprised of photopatternable PDMS.

Optionally, said polymeric body is comprised of PDMS.

Optionally, said thermal bend actuator comprises:
an active beam comprised of a thermoelastic material; and
a passive beam mechanically cooperating with said active beam, such that when a current is passed through the active beam, the active beam heats and expands relative to the passive beam, resulting in bending of the actuator.

Optionally, said active beam is fused to said passive beam.

Optionally, said active beam defines a bent current path extending between a pair of electrodes, said electrodes being connected to control circuitry for controlling said actuator.

Optionally, said thermoelastic material is selected from the group comprising: titanium nitride, titanium aluminium nitride and vanadium-aluminium alloys; and said passive beam is comprised of a material selected from the group comprising: silicon oxide, silicon nitride and silicon oxynitride.

Optionally, a microfluidic system according the present invention which is a LOC device or a Micro Total Analysis System (μTAS).

In a thirteenth aspect the present invention provides a microfluidic system comprising a pneumatic or an hydraulic pinch valve, said pinch valve comprising:
a microfluidic channel defined in a compliant body;
an inflatable control channel cooperating with a valve section of said microfluidic channel such that pneumatic or hydraulic pressurization of said control channel causes inflation of said control channel and pinching closure of said valve section,
wherein said microfluidic system comprises an on-chip MEMS pump in fluidic communication with said control channel for pressurizing said control channel.

Optionally, said valve section comprises resiliently collapsible walls.

Optionally, a wall of said control channel is engaged with a wall of said valve section.

Optionally, shutting off said pump releases a pressure in said control channel, thereby opening said valve section.

Optionally, the microfluidic system according to the present invention comprises on-chip control circuitry for controlling said pump, and thereby controlling closure of said valve section.

Optionally, the microfluidic system according to the present invention comprises a MEMS integrated circuit bonded to a microfluidics platform, said microfluidics platform comprising a polymeric body having said microfluidic channel and said control channel defined therein, and said MEMS integrated circuit comprising said MEMS pump.

Optionally, said MEMS pump comprises a plurality of moveable fingers configured as a linear peristaltic pump, each of said fingers being associated with a respective thermal bend actuator for moving a respective finger.

Optionally, each finger comprises a respective thermal bend actuator.

Optionally, said MEMS pump is positioned in a MEMS layer of said MEMS integrated circuit.

Optionally, said MEMS integrated circuit comprises a silicon substrate and said MEMS layer is formed on said substrate.

Optionally, said MEMS integrated circuit comprises control circuitry for controlling said thermal bend actuators, said control circuitry being contained in at least one CMOS layer of said substrate.

Optionally, said MEMS layer is covered with a polymeric layer.

Optionally, said polymeric layer defines a bonding surface of said MEMS integrated circuit.

Optionally, said polymeric layer is comprised of photopatternable PDMS.

Optionally, said compliant body is comprised of PDMS.

Optionally, each thermal bend actuator comprises:
an active beam comprised of a thermoelastic material; and
a passive beam mechanically cooperating with said active beam, such that when a current is passed through the active beam, the active beam heats and expands relative to the passive beam, resulting in bending of the actuator.

Optionally, said active beam is fused to said passive beam.

Optionally, said passive beam defines an extent of each finger.

Optionally, said active beam defines a bent current path extending between a pair of electrodes, said electrodes being connected to control circuitry for controlling said actuator.

Optionally, said thermoelastic material is selected from the group comprising: titanium nitride, titanium aluminium nitride and vanadium-aluminium alloys; and said passive beam is comprised of a material selected from the group comprising: silicon oxide, silicon nitride and silicon oxynitride.

BRIEF DESCRIPTION OF THE DRAWINGS

Embodiments of the present invention will now be described by way of example only with reference to the accompanying drawings, in which.

DETAILED DESCRIPTION OF THE INVENTION

Figure 1A:
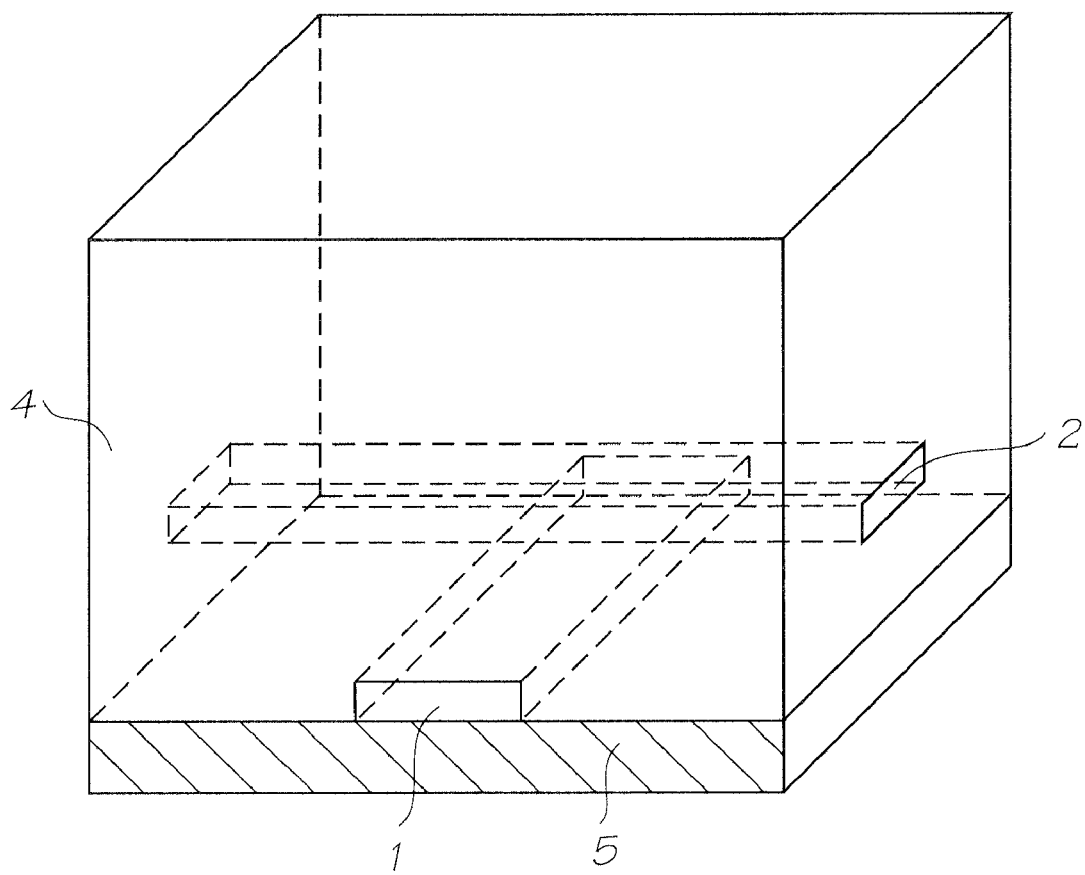
FIGS. 1A-C show a prior art valving system.

For the avoidance of doubt, the term "microfluidics", as used herein, has its usual meaning in the art. Typically microfluidic systems or structures are constructed on a micron scale and comprise at least one microfluidic channel having a width of less than about 1000 microns. The microfluidic channels usually have a width in the range of 1-800 microns, 1-500 microns, 1-300 microns 2-250 microns, 3-150 microns or 5 to 100 microns. Microfluidic systems and devices are typically capable of handling fluidic quantities of less than about 1000 nanoliters, less than 100 nanoliters, less than 10 nanoliters, less than 1 nanoliter, less than 100 picoliters or less than 10 picoliters.

As used herein, the term "microfluidic system" refers to a single, integrated unit which is usually in the form of a 'chip' (in the sense that it has similar dimensions to a typical microchip). A microfluidic 'chip' typically has width and/or length dimensions of less than about 5 cm, less than about 4 cm, less than about 3 cm, less than about 2 cm, or less than about 1 cm. The chip typically has a thickness of less than about 5 mm, less than about 2 mm or less than about 1 mm. The chip may be mounted on a passive substrate, such as a glass slide, to provide it with structural rigidity and robustness.

A microfluidic system typically comprises one or more microfluidic channels and one or more microfluidic devices (e.g. micropumps, microvalves etc). Moreover, the microfluidic systems described herein typically contain all the requisite support systems (e.g. control circuitry) for driving microfluidic devices in the system.

As used herein, the term "microfluidics platform" refers to a platform of, for example, microfluidic channels, microfluidic chambers and/or microfluidic devices, which traditionally requires external support systems for operation (e.g. off-chip pumps, off-chip control circuitry etc.). Microfluidics platforms typically have a polymeric body formed by soft lithography. As will become apparent, a microfluidics platform may form part of a bonded microfluidic system according to the present invention. Bonded microfluidic systems according to the present invention generally comprise an integrated circuit bonded to a microfluidics platform via an interfacial bond. Typically, a bonded microfluidic system has fluidic communication and/or mechanical communication between the integrated circuit and the microfluidics platform "Lab-on-a-Chip" or LOC devices are examples of microfluidic systems. Generally, LOC is a term used to indicate the scaling of single or multiple laboratory processes down to chip-format. A LOC device typically comprises a plurality of microfluidic channels, microfluidic chambers and microfluidic devices (e.g. micropumps, microvalves etc.)

A "Micro Total Analysis System" (µTAS) is an example of a LOC device specifically configured to perform a sequence of lab processes which enable chemical or biological analysis.

Any of the microfluidic systems according to the present invention may be a LOC device or a µTAS. The person skilled in the art will be capable of designing specific architectures for LOC devices (or, indeed, any microfluidic system) tailored to a particular application, utilizing the present teaching. Some typical applications of microfluidic systems are enzymatic analysis (e.g. glucose and lactate assays), DNA analysis (e.g. polymerase chain reaction and high-throughput sequencing), proteomics, disease diagnosis, analysis of air/water samples for toxins/pathogens, fuel cells, micromixers etc. The number of traditional laboratory operations that may be performed in a LOC device is virtually limitless, and the present invention is not limited to any particular application of microfluidics technology.

Thermal Bend Actuation in Inkjet Nozzle Assemblies

Hitherto, the present Applicant has described a plethora of thermal bend-actuated inkjet nozzle assemblies suitable for forming pagewidth printheads. Some elements of these inkjet nozzles are relevant to the microfluidic systems and devices described and claimed herein. Accordingly, a brief description of an inkjet nozzle assembly now follows.

Typically, inkjet nozzle assemblies are constructed on a surface of a CMOS silicon substrate. The CMOS layer of the substrate provides all the necessary logic and drive circuitry (i.e. "control circuitry") for actuating each nozzle of the printhead.

Figure 2:
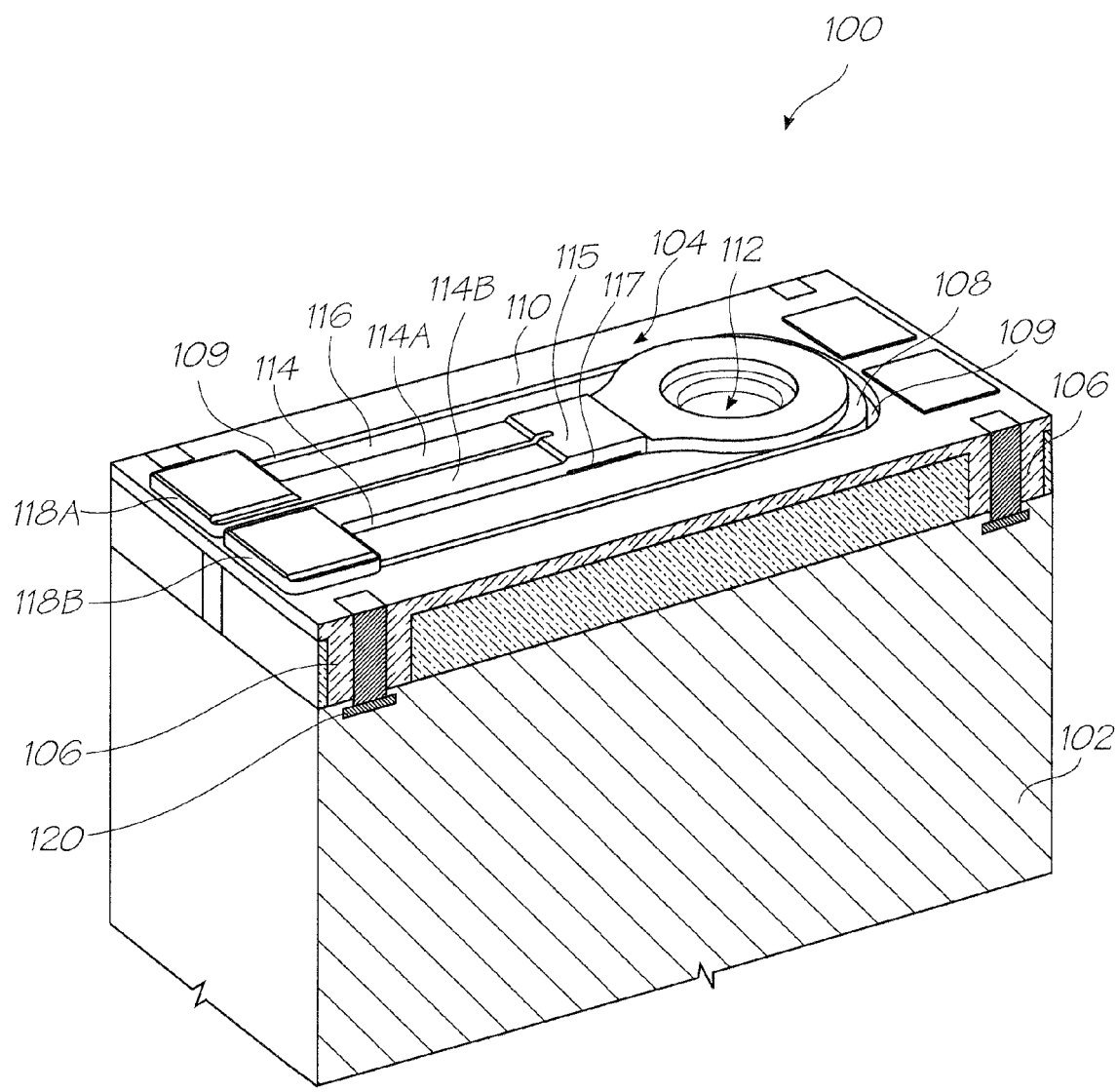
FIG. 2 shows a partially-fabricated thermal bend-actuated inkjet nozzle assembly.
Figure 3:
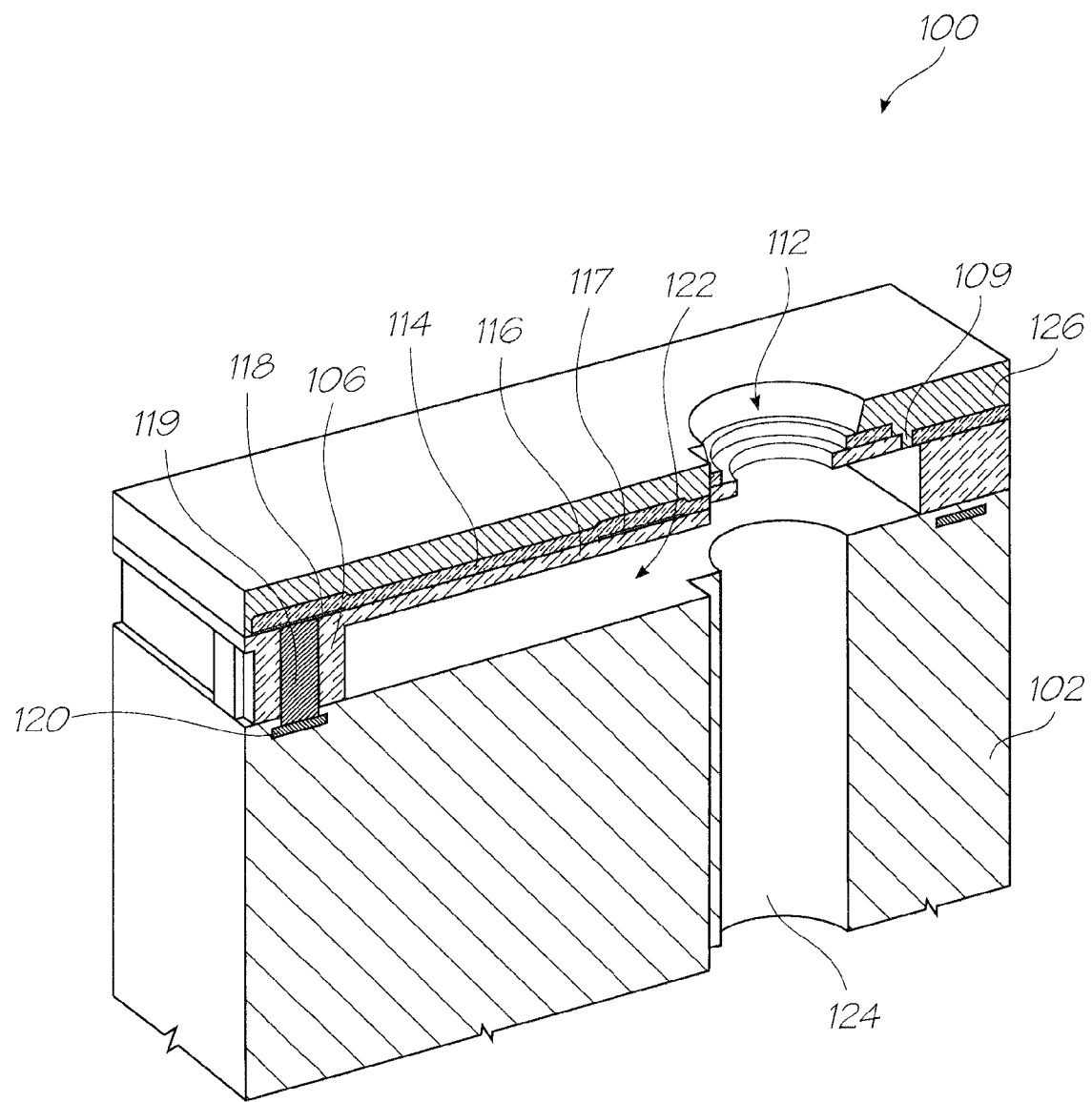
FIG. 3 is a cutaway perspective of a completed inkjet nozzle assembly.

FIGS. 2 and 3 show one such nozzle assembly 100 at two different stages of fabrication, as described in the Applicant's earlier U.S. application Ser. No. 11/763,440 filed on Jun. 15, 2007, the contents of which is incorporated herein by reference.

Figure 1B:
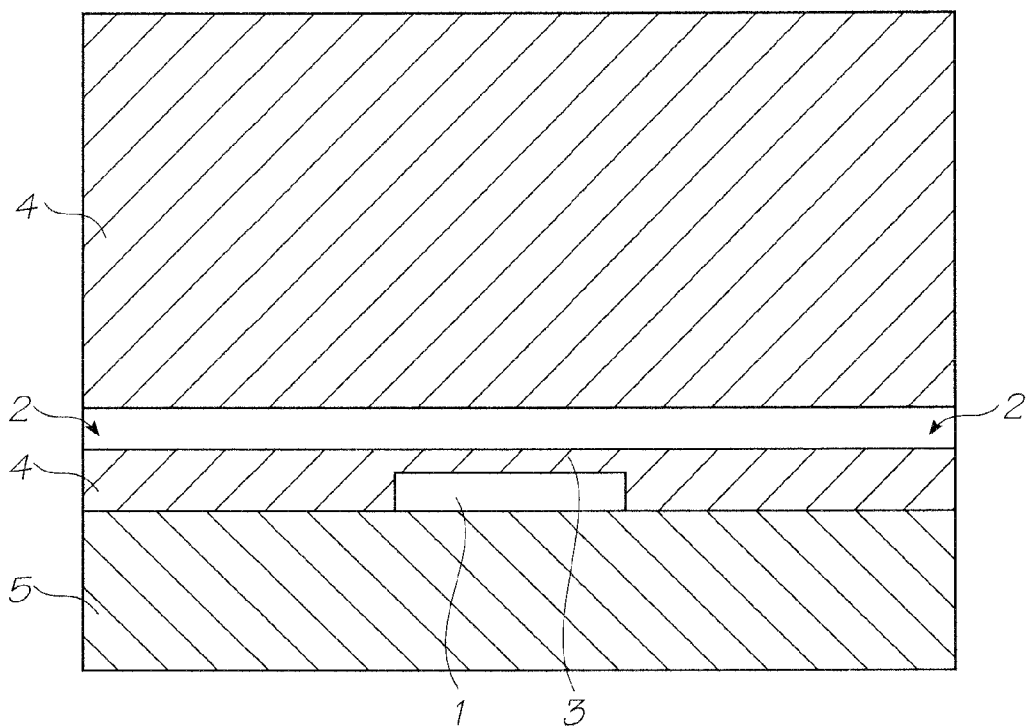
Figure 1C:
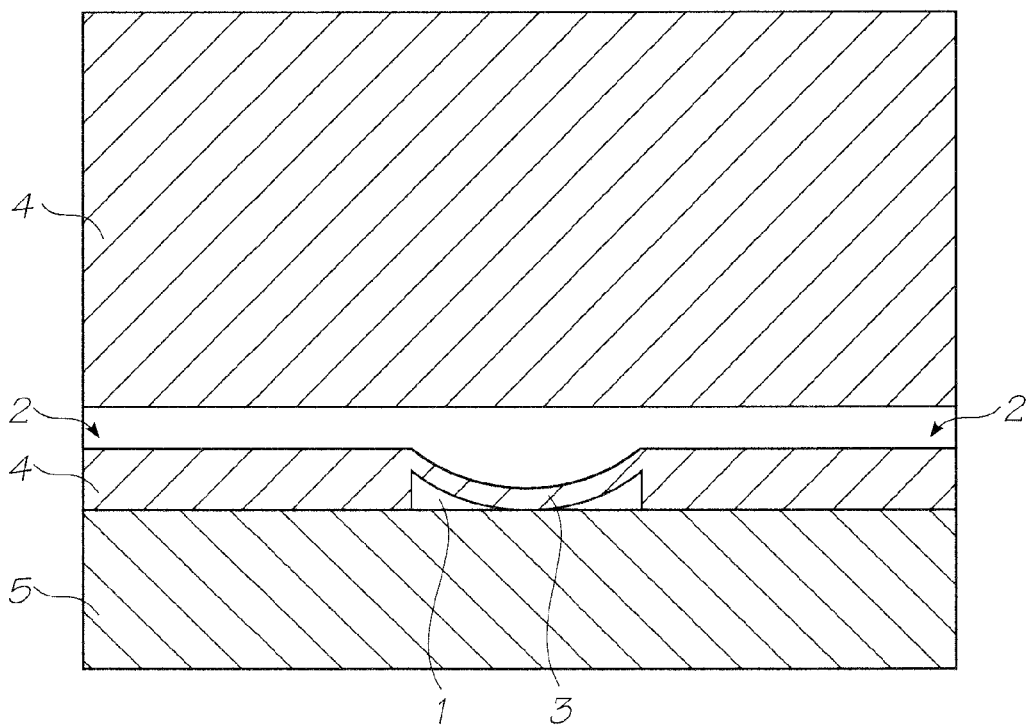

FIG. 1 shows the nozzle assembly partially formed so as to illustrate the features of bend actuator. Thus, referring to FIG. 1, there is shown the nozzle assembly 100 formed on a CMOS silicon substrate 102. A nozzle chamber is defined by a roof 104 spaced apart from the substrate 102 and sidewalls 106 extending from the roof to the substrate 102. The roof 104 is comprised of a moving portion 108 and a stationary portion 110 with a gap 109 defined therebetween. A nozzle opening 112 is defined in the moving portion 108 for ejection of ink.

The moving portion 108 comprises a thermal bend actuator having a pair of cantilever beams in the form of an upper active beam 114 fused to a lower passive beam 116. The lower passive beam 116 defines the extent of the moving portion 108 of the roof. The upper active beam 114 comprises a pair of arms 114A and 114B which extend longitudinally from respective electrode contacts 118A and 118B. The arms 114A and 114B are connected at their distal ends by a connecting member 115. The connecting member 115 comprises a titanium conductive pad 117, which facilitates electrical conduction around this join region. Hence, the active beam 114 defines a bent or tortuous conduction path between the electrode contacts 118A and 118B.

The electrode contacts 118A and 118B are positioned adjacent each other at one end of the nozzle assembly and are connected via respective connector posts 119 to a metal CMOS layer 120 of the substrate 102. The CMOS layer 120 contains the requisite drive circuitry for actuation of the bend actuator.

The passive beam 116 is typically comprised of any electrically/thermally-insulating material, such as silicon dioxide, silicon nitride etc. The thermoelastic active beam 114 may be comprised of any suitable thermoelastic material, such as titanium nitride, titanium aluminium nitride and aluminium alloys. As explained in the Applicant's copending U.S. application Ser. No. 11/607,976 filed on 4 Dec. 2006, vanadium-aluminium alloys are a preferred material, because they combine the advantageous properties of high thermal expansion, low density and high Young's modulus.

Referring to FIG. 3, there is shown a completed nozzle assembly at a subsequent stage of fabrication. The nozzle assembly 100 of FIG. 2 has a nozzle chamber 122 and an ink inlet 124 for supply of ink to the nozzle chamber. In addition, the entire roof is covered with a layer of polydimethylsiloxane (PDMS). The PDMS layer 126 has a multitude of functions, including: protection of the bend actuator, hydrophobizing the roof 104 and providing a mechanical seal for the gap 109. The PDMS layer 126 has a sufficiently low Young's modulus to allow actuation and ejection of ink through the nozzle opening 112.

A more detailed description of the PDMS layer 126, including its functions and fabrication, can be found in, for example, U.S. application Ser. No. 11/946,840 filed on Nov. 29, 2007 (the contents of which are herein incorporated by reference).

When it is required to eject a droplet of ink from the nozzle chamber 122, a current flows through the active beam 114 between the electrode contacts 118. The active beam 114 is rapidly heated by the current and expands relative to the passive beam 116, thereby causing the moving portion 108 to bend downwards towards the substrate 102 relative to the stationary portion 110. This movement, in turn, causes ejection of ink from the nozzle opening 112 by a rapid increase of pressure inside the nozzle chamber 122. When current stops flowing, the moving portion 108 is allowed to return to its quiescent position, shown in FIGS. 2 and 3, which sucks ink from the inlet 124 into the nozzle chamber 122, in readiness for the next ejection.

From the foregoing, it will be appreciated that the PDMS layer 126 significantly improves operation of the nozzle assembly 100. As described in U.S. application Ser. No. 11/946,840, the formation of the PDMS layer 126 is made possible through the integration of spin-on photopatternable PDMS with a MEMS fabrication process. The Applicant has developed a versatile MEMS fabrication process utilizing photopatternable PDMS, which may be modified for use in a plethora of applications. Microfluidics devices and systems utilizing PDMS are described hereinbelow.

Microfluidic Pump

Figure 4:
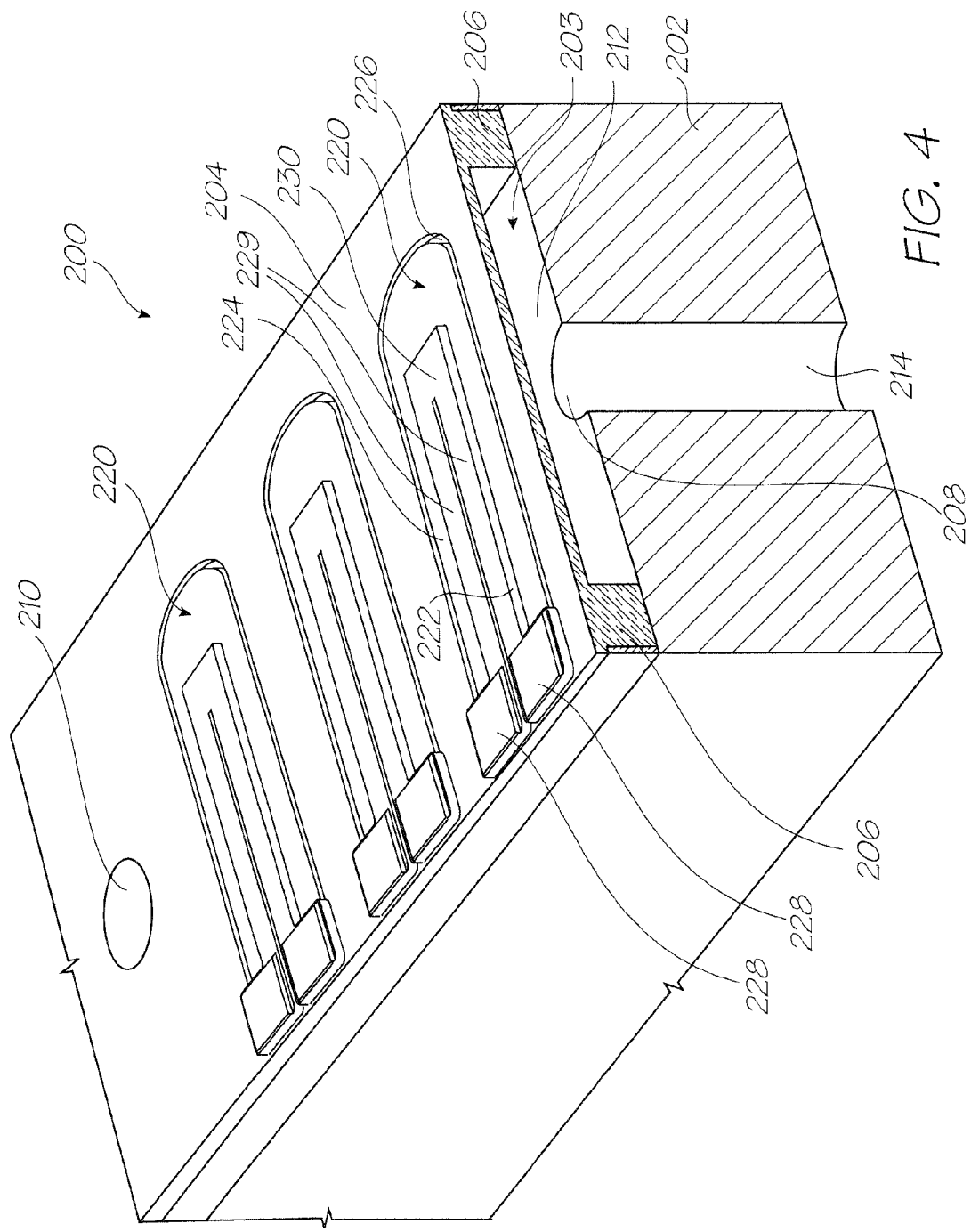
FIG. 4 is a perspective of a MEMS microfluidic pump with a polymeric sealing layer removed to reveal MEMS devices.
Figure 5:
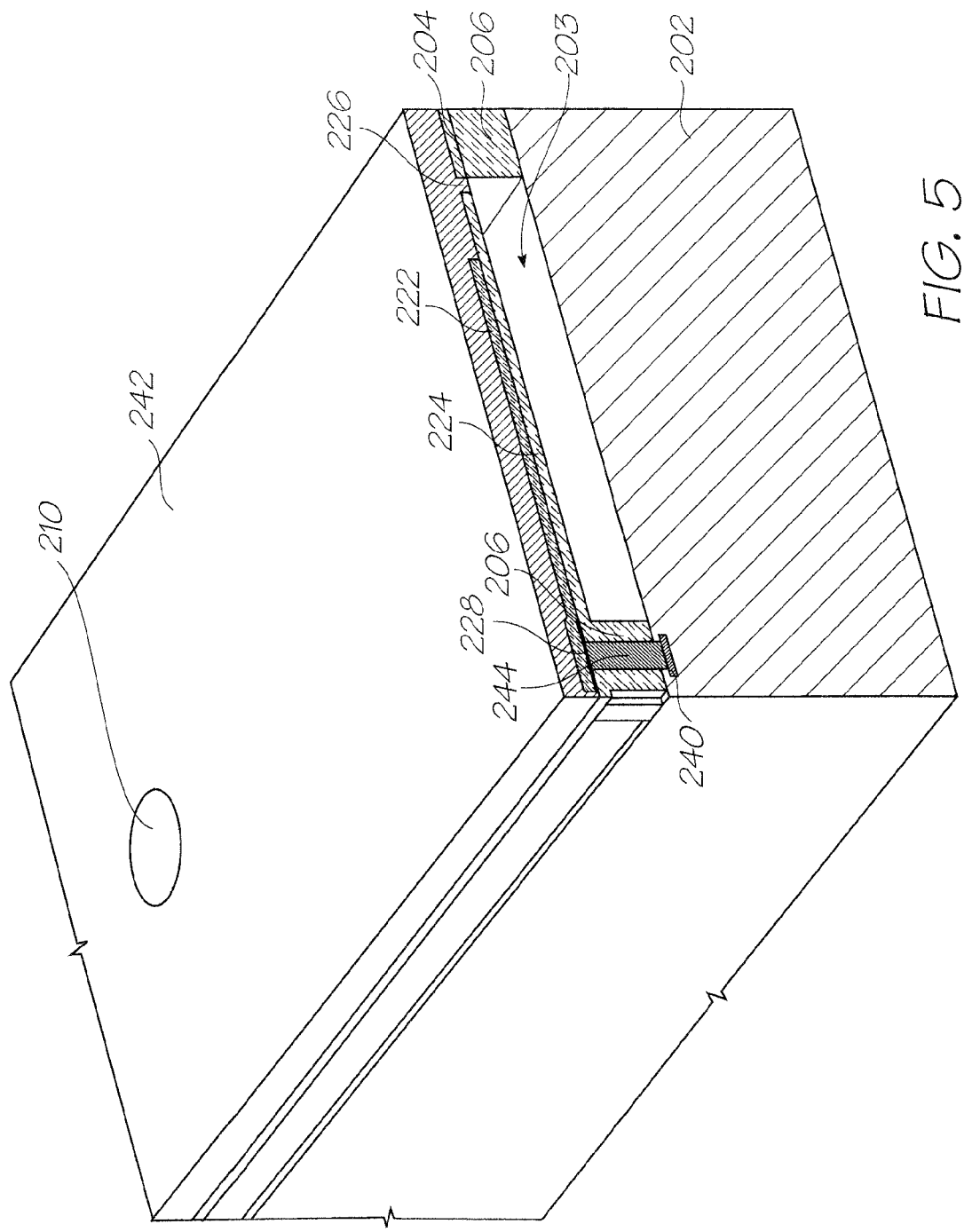
FIG. 5 is a cutaway perspective of the pump shown in FIG. 4 which includes the polymeric sealing layer.

FIGS. 4 and 5 show a linear peristaltic pump 200, comprising a row of MEMS devices, each of which is similar in construction to the thermal bend-actuated inkjet nozzle assembly 100 described above. FIG. 4 shows the pump 200 in perspective view with an upper PDMS layer removed to reveal details of each MEMS device.

The linear peristaltic pump 200 is formed on a surface of a CMOS silicon substrate 202. A pumping chamber 203 is defined by a roof 204 spaced apart from the substrate 202 and sidewalls 206 extending from the roof to the substrate 202. The roof 204 and sidewalls 206 are typically comprised of silicon oxide or silicon nitride and are constructed using a fabrication process analogous to the process described in U.S. application Ser. No. 11/763,440.

The pumping chamber 203 takes the form of an elongate channel extending longitudinally between a pump inlet 208 and a pump outlet 210. As shown in FIG. 4, the pump inlet 208 is defined in a floor 212 of the pumping chamber 203 and a fluid is fed to the pump inlet 108 via a pump inlet channel 214 defined through the silicon substrate. The pump outlet 210 is defined in the roof 204 of the pumping chamber 203, at an opposite end to the pump inlet 108. This arrangement of pump inlet 208 and pump outlet 210 is specifically configured for providing fully integrated LOC devices as described below. However, it will be appreciated that in its broadest form, the peristaltic pump 200 may have any suitable arrangement of pump inlet and outlet, provided that peristaltic pumping fingers are positioned therebetween.

FIG. 4, having the upper PDMS layer removed, shows three peristaltic pumping fingers 220 arranged in a row and spaced apart along the longitudinal extent of the pumping chamber 203. By analogy with the inkjet nozzle assembly 100 described above, each finger 220 is moveable into the pumping chamber 203 by thermal bend actuation. Thus, each finger 220 comprises a MEMS thermal bend actuator in the form of an active beam 222 cooperating with a passive beam 224. Typically, the active beam 222 is fused to the passive beam 224, and the passive beam 224 defines the extent of each moving finger 220.

The passive beam 224 is usually formed of the same material as the roof 204, and the finger 220 is separated from the roof by a perimeter gap 226, which is defined by an etch process during MEMS fabrication.

The active beam 222 defines a bent current path extending between a pair of electrode contacts 228. In keeping with the inkjet nozzle assembly 100, the active beam 222 comprises a pair of arms 229 extending from respective electrode contacts 228. The arms 229 are connected at their distal ends by a connecting member 230.

Each finger 220 extends transversely across the roof 204 of the longitudinal channel defined by the pumping chamber 203. Hence, it will be appreciated that by controlling movement of each finger 220, a peristaltic pumping action may be imparted on a fluid contained in the pumping chamber 203. The skilled person will be aware of linear peristaltic pumps employing a similar pumping action, as described in, for example, U.S. Pat. No. 4,909,710, the contents of which are herein incorporated by reference.

Control of each finger actuation is provided by a CMOS layer 240 in the silicon substrate 202, shown in FIG. 5. FIG. 5 is a perspective of the pump 200 including an upper polymeric sealing layer 242 of PDMS. The pump 200 is cutaway through one of the fingers 220 to reveal part of a metal CMOS layer 240. The CMOS layer 240 connects with each electrode contact 228 via a connector post 244, which extends from the CMOS layer, through the sidewalls 206, and meets with the electrode contact. The CMOS layer 240 contains all the necessary control and drive circuitry for actuating each finger 220. Hence, a chip comprising the pump 200 contains all the requisite control and drive circuitry for actuating the pump, without the need for any external off-chip control. On-chip control is one of the advantages of the pump 200 according to the present invention.

Moreover, in contrast with peristaltic pumps built from an array of 'Quake' valves (as described in U.S. Pat. No. 7,258,774), the pump 200 does not require any control fluid (e.g. air) to drive the peristaltic action. Whereas 'Quake' valves (and thereby 'Quake' pumps) are reliant on fluid in a control channel, which must be supplied externally, the mechanically-actuated pump 200 is fully self-contained and does not require any external input, except, of course, for the actual fluid which is to be pumped.

Referring again to FIG. 5, the polymeric sealing layer 242 (typically PDMS) is deposited onto the roof 204, and the pump outlet 210 defined therethrough, using fabrication techniques analogous to those described in U.S. application Ser. No. 11/763,440. Of course, the polymeric layer 242 has sufficiently low Young's modulus to enable movement of each finger 220 during actuation. The polymeric layer 242 principally provides a mechanical seal for the perimeter gap 226 around each finger 220, but also provides a protective layer for each thermal bend actuator.

Furthermore, PDMS provides an ideal bonding surface for bonding a MEMS integrated circuit comprising the microfluidic pump 200 to a conventional microfluidics platform formed by soft lithography. Integration of a MEMS integrated circuit with a conventional LOC platform is a particularly advantageous feature of the present invention and will be described in more detail below.

Alternative Microfluidic Pump

Figure 6:
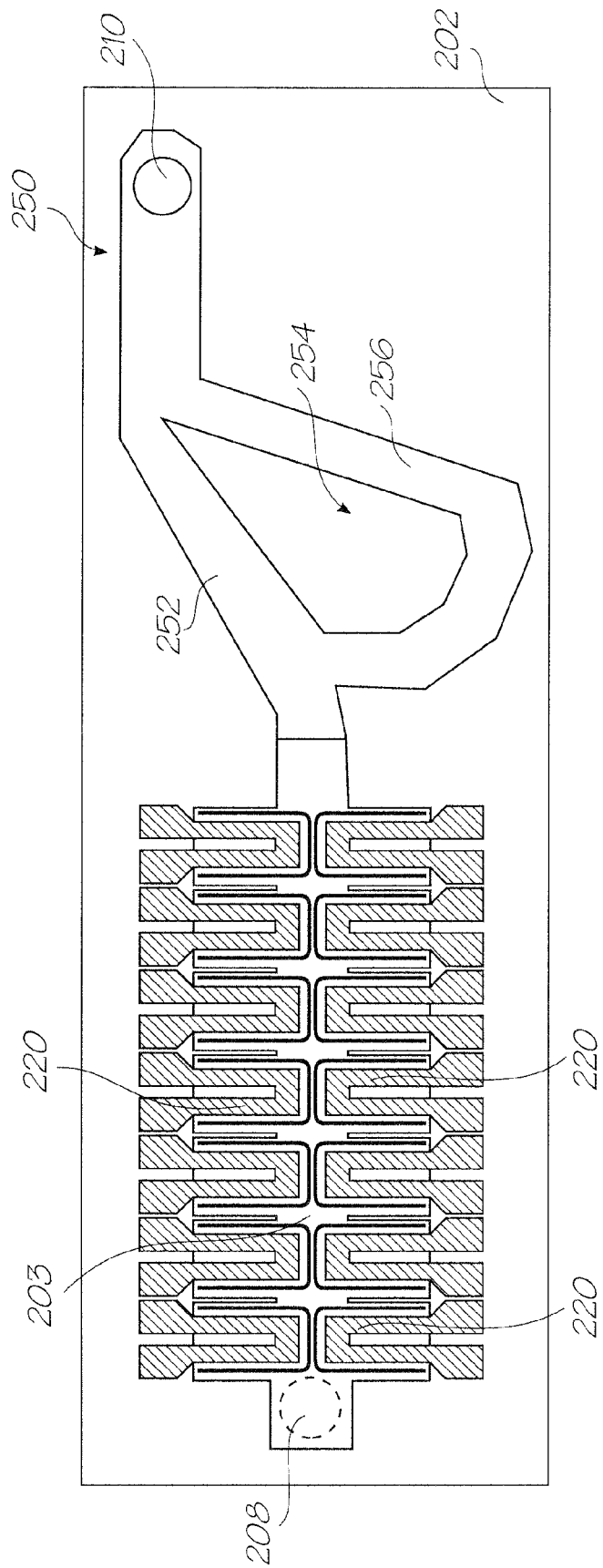
FIG. 6 is a plan view of an alternative MEMS microfluidic pump.

Of course, the pump 200 may take many different forms. For example, the number and orientation of the fingers 220 may be modified to optimize the peristaltic pumping action. Turning now to FIG. 6, there is shown in plan view an alternative linear peristaltic pump 250 employing the same operational principles as the pump 200 described above. In FIG. 6, the upper polymeric layer 242 has been removed to reveal the individual fingers 220 and the pumping chamber 203. In the interests of clarity, like reference numerals have been used to describe like features in FIG. 6.

Thus, the pump 250 comprises a pumping chamber 203 in the form of a longitudinal channel. Pairs of opposed fingers 220 are positioned in the roof of the chamber 203, and a plurality of finger pairs extend longitudinally in row along the chamber. Each finger 220 in a pair points towards a central longitudinal axis of the chamber 203 so as to maximize the peristaltic pumping action by simultaneous actuation of both fingers in a pair. During pumping, opposed pairs of fingers may be actuated (e.g. sequentially) to provide the peristaltic pumping action. Of course, any sequence of actuations may be employed to optimize pumping, as described in, for example, U.S. Pat. No. 4,909,710. In some pumping cycles, more than one finger pair may be actuated simultaneously, or some finger pairs may be partially actuated. The skilled person will readily be able to conceive of optimal peristaltic pumping cycles, within the ambit of the present invention, utilizing the pump 250.

Still referring to FIG. 6, the fingers 220 are positioned between a pump inlet 208 and a pump outlet 210. An outlet channel 252 between the pump outlet 210 and the fingers 220 comprises a valve system 254. The valve system 254 comprises a channel circuit 256, which is configured to minimize backflow of fluid from the outlet 210 towards the inlet 208. Thus, the valve system 254 further optimizes the efficiency of the pump 250. Although a very simple valve system 254 is shown in FIG. 6, it will appreciated that any check valve may be used to improve the efficiency of a one-way pump according to the present invention.

Of course, pumps according to the present invention may be made reversible, simply by altering the sequence of finger actuations via the on-chip CMOS.

Fully Integrated LOC Device Comprising MEMS Micropumps

As foreshadowed above, a PDMS polymeric layer 242 provides an ideal bonding surface for bonding MEMS integrated circuits to conventional microfluidic platforms formed by soft lithography. This enables integration of CMOS control circuitry with microfluidic devices in a fully integrated LOC device. Therefore, a significant advantage is achieved by obviating the need for external off-chip control systems and pumping systems, which are usually required in conventional LOC devices.

Interfacial bonding between a conventional PDMS microfluidics platform and a PDMS-coated MEMS integrated circuit is achieved using conventional techniques known from multilayer PDMS soft lithography. Such techniques will be well known to a person skilled person in the art of soft lithography. Typically, each PDMS surface is exposed to an oxygen plasma and the two surfaces bonded together by applying pressure.

Figure 7:
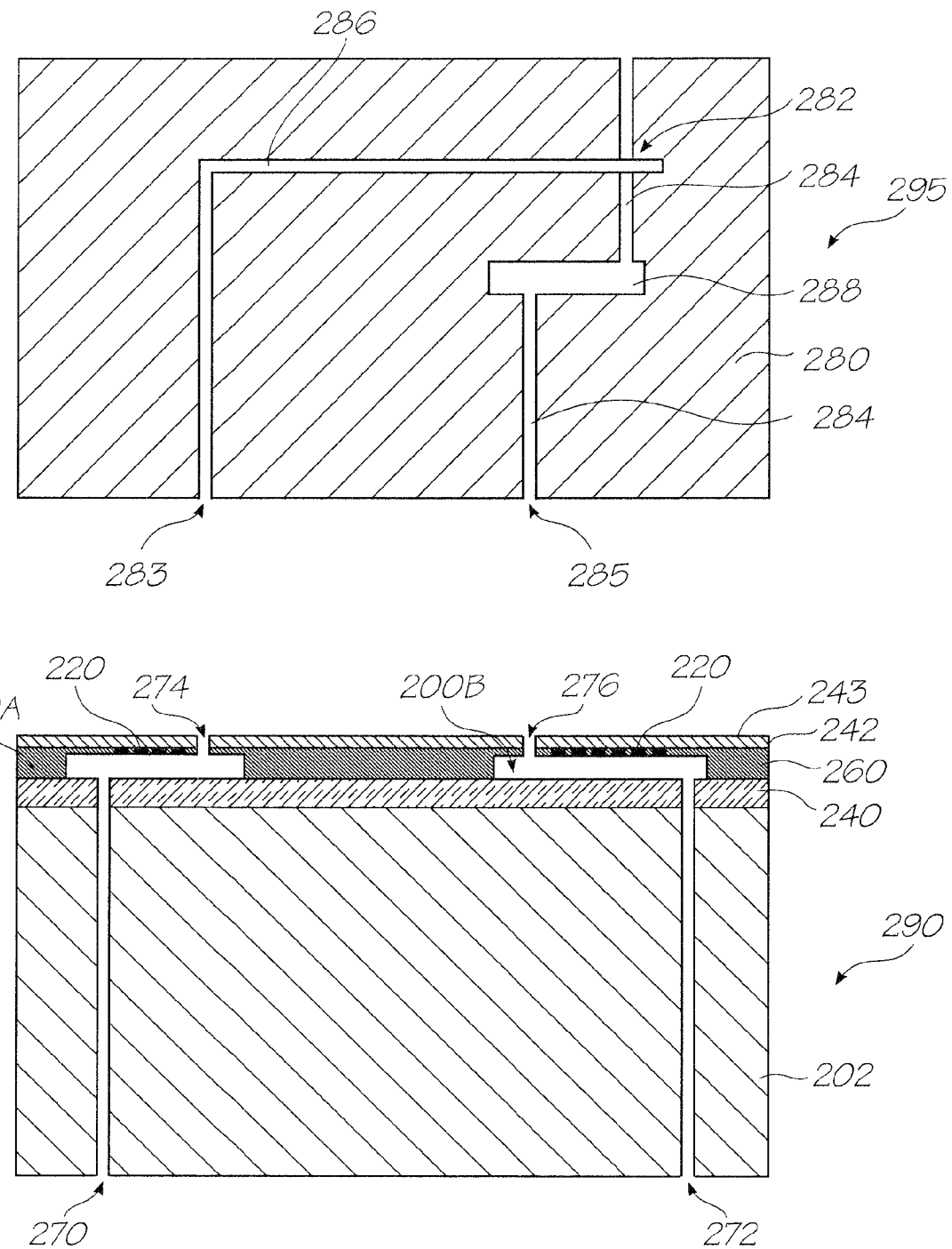
FIG. 7 shows schematically a microfluidics platform and a MEMS integrated circuit prior to bonding.

FIG. 7 shows how a simple integrated LOC device according to the present invention may be fabricated using a conventional PDMS bonding technique. A MEMS integrated circuit (or chip) 290 comprises a silicon substrate 202, a CMOS layer 240 and MEMS layer 260. The MEMS layer 260 comprises MEMS microfluidic pumps 200. In the schematic integrated circuit 290, two MEMS microfluidic pumps 200A and 200B are shown, each comprising a plurality of thermal bend-actuated fingers 220 for providing a peristaltic pumping action. Of course, in practice, each MEMS integrated circuit 290 may comprise many hundreds or thousands of MEMS devices, including the pumps 200.

The MEMS layer 260 is covered with the PDMS layer 242, which defines an external bonding surface 243 of the integrated circuit 290.

A conventional microfluidics platform 295 is comprises of a body 280 of PDMS in which is defined a plurality of microfluidic channels, chambers and/or microfluidic devices. In the schematic microfluidics platform 295 shown in FIG. 7, there is shown a 'Quake' valve 282 comprising a fluidic channel 284 cooperating with a control channel 286. An arbitrary reaction chamber 288 is also defined in the PMDS body 280. It will be appreciated that any three-dimensional microfluidics platform 295 may be formed by conventional soft lithographic techniques, as known in the art.

The body 280 of the microfluidics platform 295 has a bonding surface 281, in which is defined a control fluid inlet 283 and a fluid channel inlet 285. The control fluid inlet 283 and fluid channel inlet 285 are in fluid communication with their respective control channel 286 and fluid channel 284. The control fluid inlet 283 and fluid channel inlet 285 of the microfluidics platform 295 are positioned to align with pump outlets 274 and 276 defined in the PDMS layer 242 of the MEMS integrated circuit 290.

Figure 8:
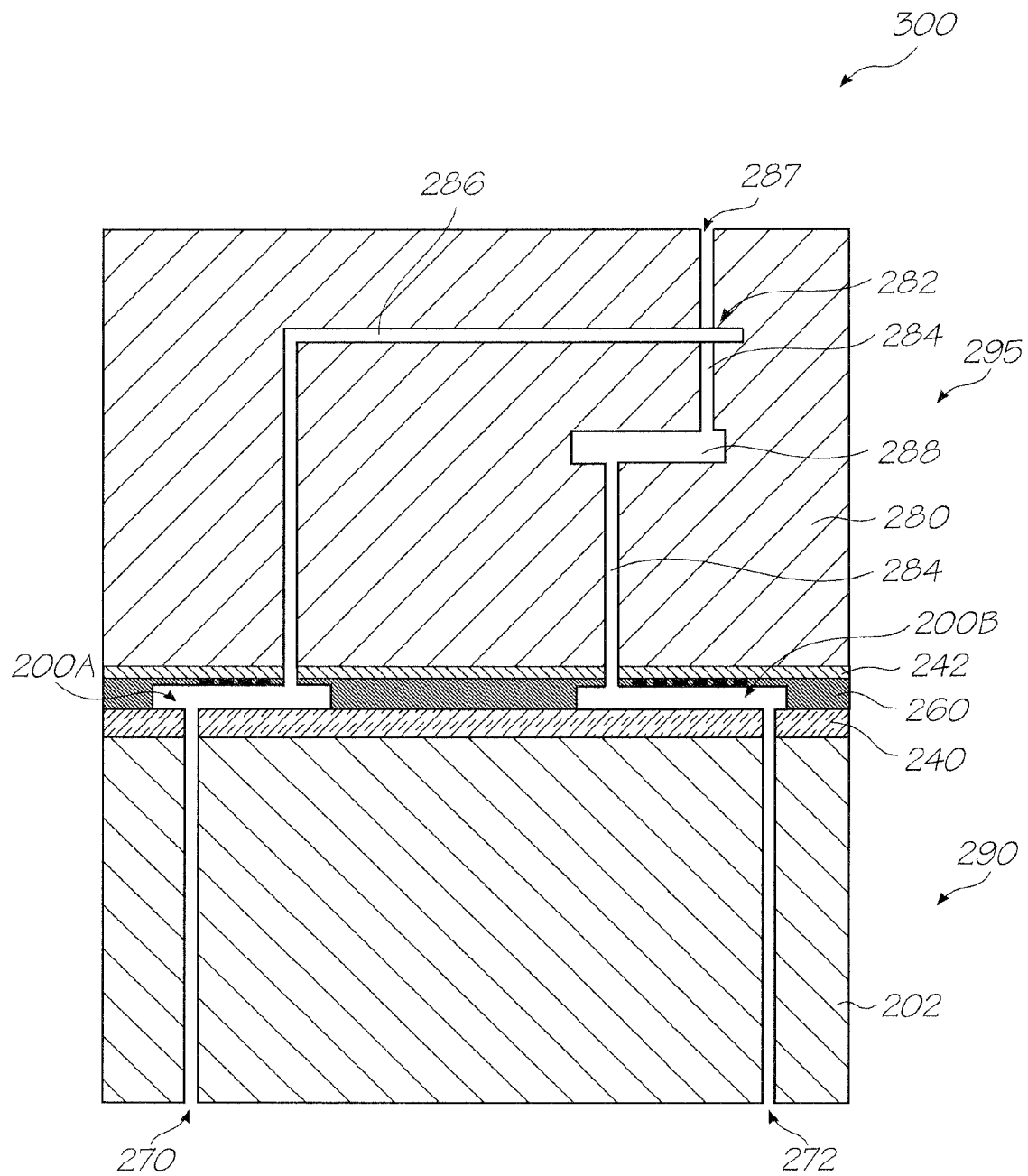
FIG. 8 shows schematically an integrated LOC device comprising a bonded microfluidics platform and MEMS integrated circuit.

The two bonding surfaces 243 and 281 are bonded together by exposing each surface to an oxygen plasma and then applying pressure. The resultant bonded assembly, in the form of an integrated LOC device 300, is shown in FIG. 8.

In the integrated LOC device 300, the pumps 200 controlled by the CMOS layer 240 of the integrated circuit 290 pump fluid into microfluidic channels 286 and 284 of the PDMS microfluidics platform. The pumps 200 may pump either control fluid (for driving valves in the PDMS platform 295) or actual sample fluids used by the device (e.g. fluids for analysis). Accordingly, the CMOS control circuitry can be used to provide full control over operation of the integrated LOC device 300.

A simple example will now be described to illustrate how the LOC device 300 may be operated in practice. A control fluid enters a first inlet 270 and is pumped, using the microfluidic pump 200A, into the control channel 286 of the microfluidics platform 286. The control channel 286 becomes pressurized with the control fluid. As described above in connection with FIGS. 1A-C, the control channel 286 overlays and cooperates with part of the fluid channel 284 to form the valve 282. When the control channel 286 is pressurized with the control fluid, a wall of the fluid channel 284 is collapsed, which closes the valve 282. Accordingly, a section of the fluid channel 284 downstream of the chamber 288 is closed by the valve 282, thereby fluidically isolating a device outlet 287 from the chamber 288.

With the valve 282 closed, a sample fluid entering a second inlet 272 is pumped, using microfluidic pump 200B, into the chamber 288 via the fluid channel 284. Further fluids (e.g. reagents) may be also be pumped into the chamber 288 via further fluid channels (not shown). Once all fluids have been pumped into the chamber 288 and sufficient time has elapsed, the valve 282 may be opened by shutting off the pump 200A, and allowing fluid to flow through the downstream section of the fluid channel 284 towards the device outlet 287.

This simple example illustrates how the integrated LOC device 300 can provide full control over LOC operations via the CMOS circuitry and MEMS micropumps 200. It is a particular advantage of the LOC device 300 that external, off-chip pumps and/or control systems are not required. The control fluid may be either air (providing pneumatic control of the valve 282) or a liquid (providing hydraulic control of the valve 282).

Although the example provided herein is very simple, the skilled person will appreciate that the present invention may be used to provide control of a complex LOC device having a complex, labyrinthine array of valves, pumps and channels.

A notable advantage of the present invention is that it fully complements existing LOC technology based on soft lithographic fabrication of microfluidics platforms. Complex microfluidics platforms have already been fabricated using soft lithography. These conventional platforms would require only minor modifications in order to be integrated into the CMOS-controllable LOC devices provided by the present invention.

Microfluidic Valves

As foreshadowed above, silicon-based MEMS technology has inherent limitations in the microfluidics and LOC fields. Microfluidic valves are usually essential in LOC devices and hard, inflexible materials such as silicon are unable to provide the sealing engagement required in a valve. Indeed, this limitation was the primary reason that microfluidics moved away from silicon-based MEMS lithography into soft lithography, based on compliant polymers, such as PDMS.

Hitherto, the present Applicant has demonstrated how PDMS can be integrated into a conventional silicon-based MEMS fabrication process. It will be described how this same technology enables effective microfluidic valves to be created using conventional silicon-based MEMS technology. Moreover, such valves do not require external fluidic supplies or control systems, in contrast with the 'Quake' valves described above. Two types of valve are described below, although the skilled person will be able to conceive of many other variants by integrating PDMS into a silicon-based MEMS fabrication process. In each case, engagement of a PDMS surface with another surface (e.g. silicon surface, silicon oxide surface, PDMS surface etc.) provides the sealing engagement necessary for a valving action. Furthermore, each valve takes the form of a mechanically-actuated valve, where engagement of opposed surfaces is driven by actuation or deactuation of a thermal bend actuator, which is itself controlled by on-chip CMOS.

Valve Providing Closure in a Polymeric Microfluidics Channel

Figure 9:
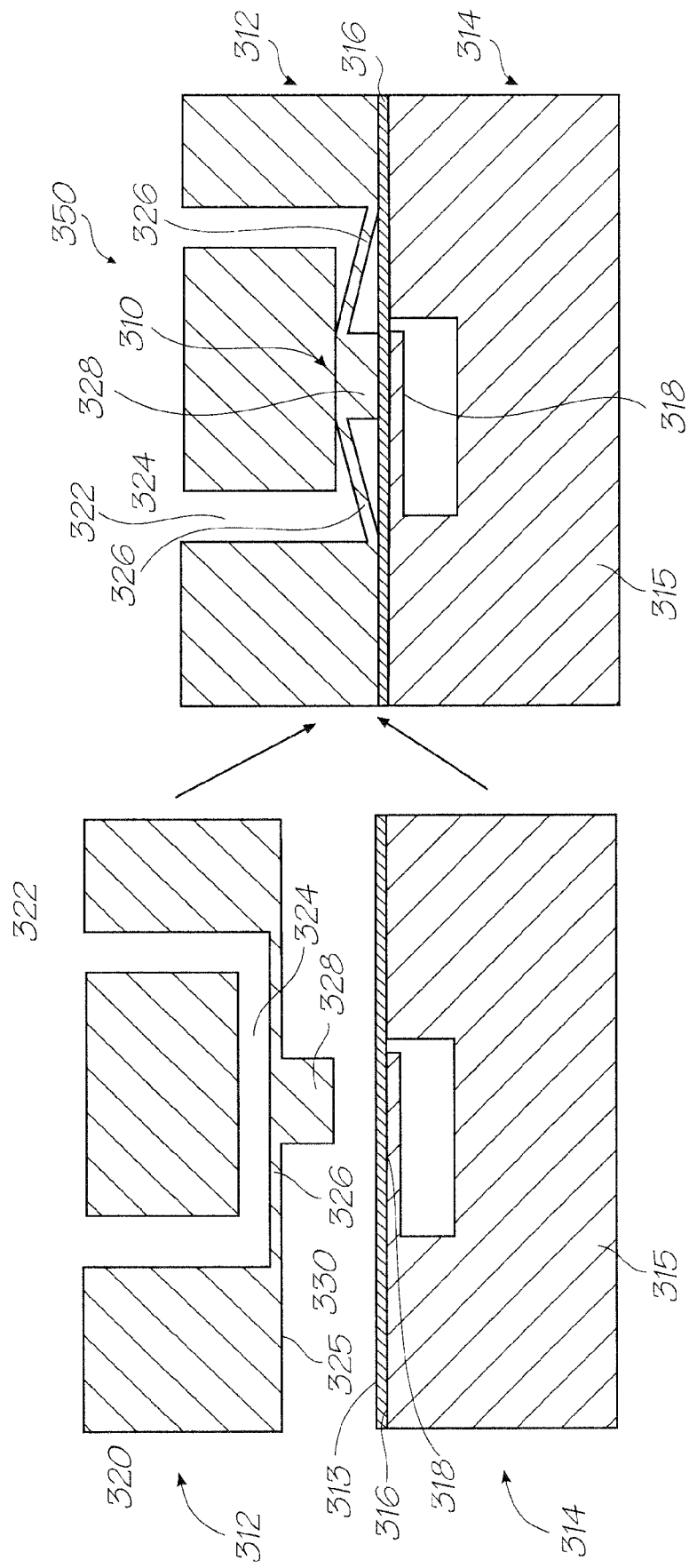
FIG. 9 shows schematically a microfluidic pinch valve fabricated by bonding a microfluidics platform with a MEMS integrated circuit.

Referring to FIG. 9, there is shown a microfluidics pinch valve 310 resulting from bonding of a polymeric microfluidics platform 312 and a MEMS integrated circuit 314 having a surface layer of PDMS 316. The PDMS layer 316 defines a first bonding surface 313 of the MEMS integrated circuit 314.

The MEMS integrated circuit 314 comprises an actuation finger 318 constructed on a CMOS silicon substrate 315. The actuation finger 318 may be identical in design to one of the fingers 220 described above in connection with FIGS. 4 and 5. Thus, although the actuator finger 318 is shown only schematically in FIG. 9, it can be assumed that it contains all features, including the thermal bend actuator, described above in relation to the fingers 220.

The microfluidics platform 312 is formed by standard soft lithography and comprises a polymeric body (e.g. PDMS body) 320, in which is defined a microfluidics channel 322. The channel 322 includes a sleeve portion 324, which passes adjacent a second bonding surface 325 of the microfluidics platform 312. The sleeve portion 324 is separated from the second bonding surface 325 by a layer of PDMS which defines an exterior wall 326 of the sleeve portion. The exterior wall 326 comprises a compression member 328, which protrudes from the exterior wall and extends away from the second bonding surface 325.

As can be seen from FIG. 9, when the two bonding surfaces 313 and 325 are bonded together, the compression member 328 is aligned with the actuation finger 318. By virtue of projecting from the exterior wall 326, the compressions member 328 abuts against the first bonding surface 313 during the bonding process, and is consequently compressed against an interior wall 330 of the sleeve portion 324. Hence, the sleeve portion 324 is pinched closed by the bonding process.

Figure 10:
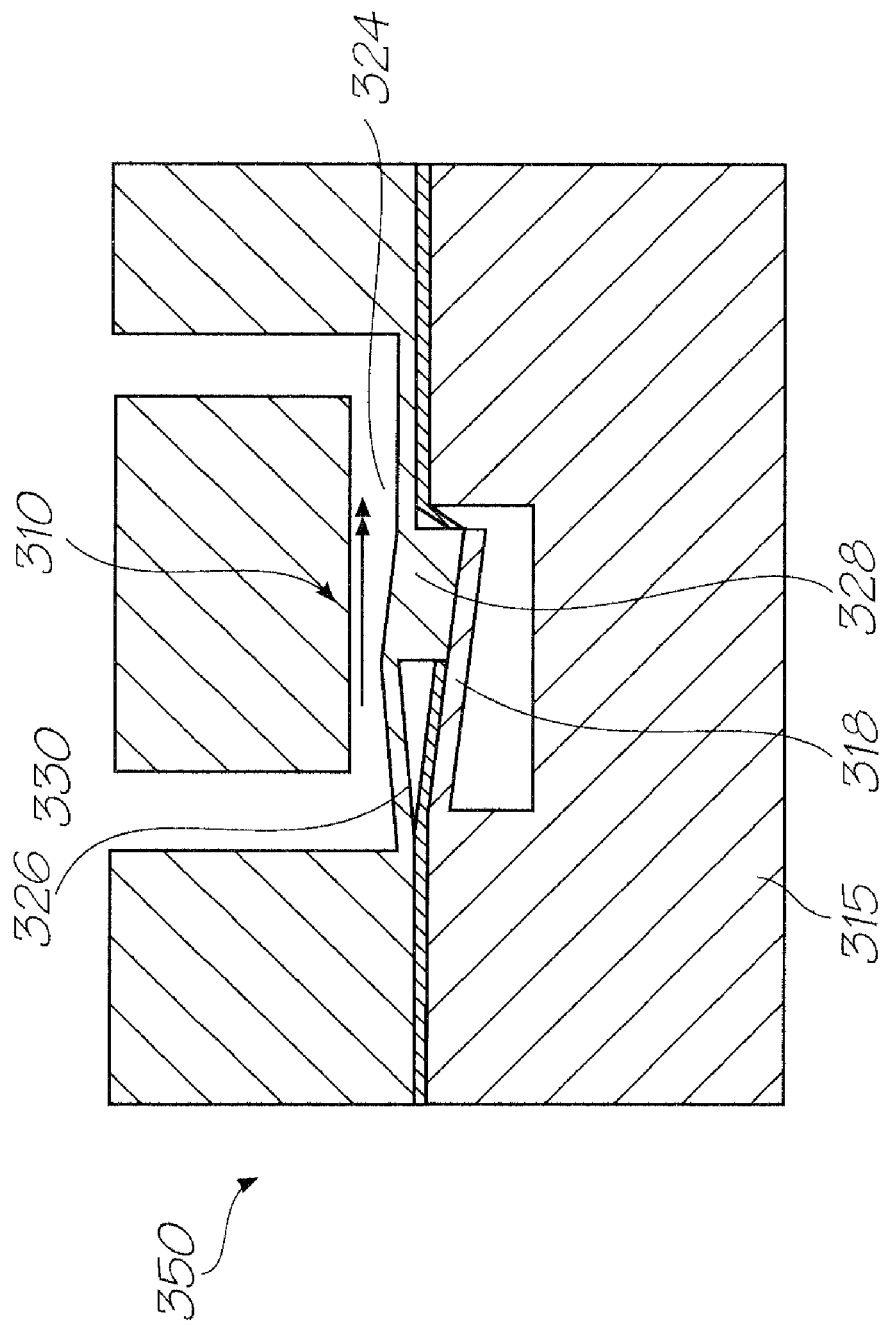
FIG. 10 shows the microfluidic pinch valve of FIG. 9 in an open position.

In the assembled LOC device 350 shown in FIG. 9, the valve 310 is closed when the actuation finger 318 is in its quiescent state, and no fluid can pass through the sleeve portion 324. Referring now to FIG. 10, the finger actuator 318 is actuated and bends downwards, thereby pulling the compression member 318 with it towards the silicon substrate 315. This actuation urges the exterior wall 326 away from the interior wall 330 and, hence, the valve 310 is opened so as to allow fluid to pass through the sleeve portion 324.

It is an advantage of the valve 310 that it is biased to be closed when the finger actuator 318 is in its quiescent state. This means that a LOC device comprising the valve 310 will not be power hungry. A further advantage is that it is possible to regulate opening of the valve by modulating an actuation power supplied to the finger actuator 318. Partial valve closures may be readily achieved using this mechanically-actuated pinch valve.

Figure 11:
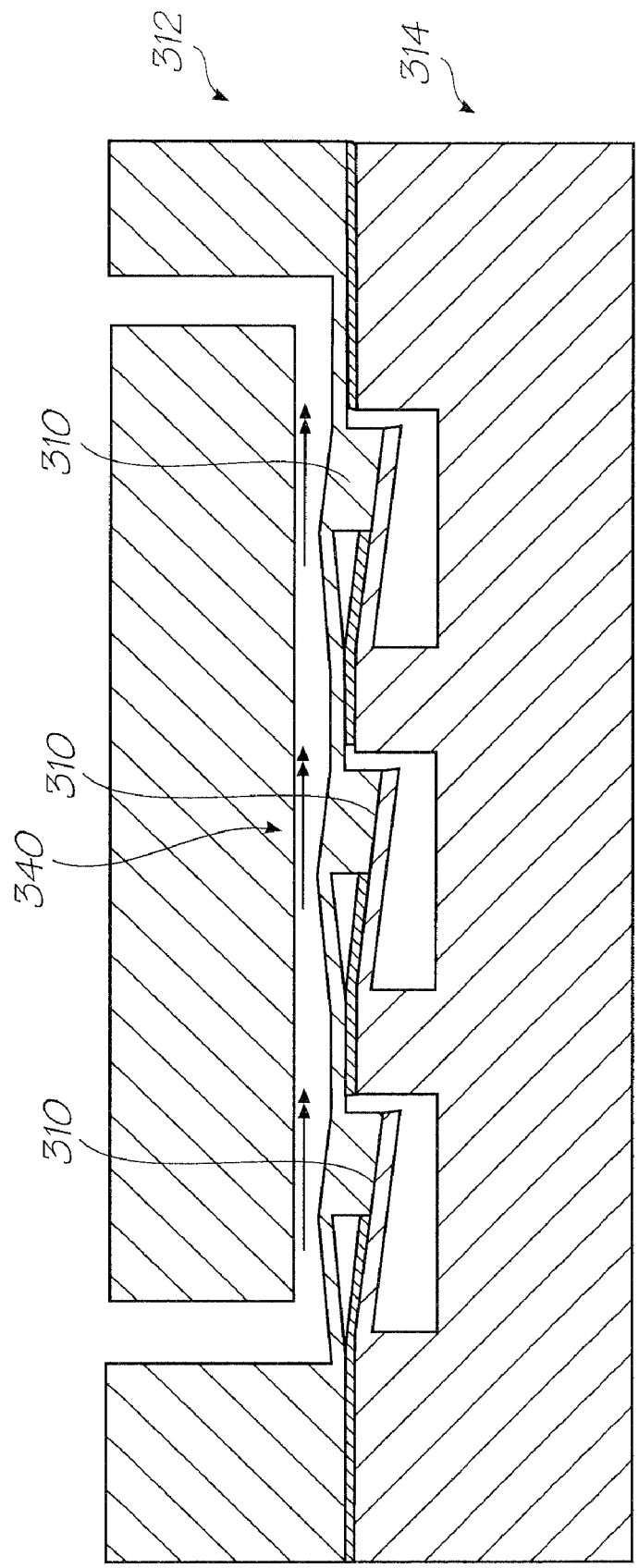
FIG. 11 shows a multifunctional device comprising a plurality of microfluidic pinch valves, as shown in FIG. 10, arranged in series.

Self-evidently, a plurality of valves 310 may be arranged in series to provide a microfluidic device 340, as shown in FIG. 11. The device 340 may be configured to provide a peristaltic pumping action.

Alternatively, the device 340 may simply provide a more effective valving action via concerted actuation of each finger actuator 318.

The device 340 can also be configured to create a turbulent flow, which is useful for mixing fluids. Typically, fluids flowing on a microscale are difficult to mix due to laminar flow. Accordingly, the device 340 may be used as a "micromixer". It will be appreciated that optimal mixing actions may be different from peristaltic pumping actions. It is advantage of the present invention that the device 340 may be used interchangeably as either a valve, a micromixer or peristaltic pump. The CMOS control circuitry may be configured to provide either a valving action, a mixing action or a pumping action in the device 340, simply by altering an actuation sequence for the finger actuators 318.

Alternatively, when used as a pump, the device 340 may be 'tuned' to the individual characteristics of a particular fluid. For example, more viscous liquids may require a different (e.g. slower) peristaltic pumping cycle to less viscous liquids. It is an advantage of the present invention that the CMOS control circuitry, individually controlling each finger actuator 318, may be configured accordingly so as to 'tune' the pump to the characteristics of particular fluid. The control achievable by the on-chip CMOS circuitry would not be possible using traditional LOC technology.

Valve Providing Closure in a Silicon Microfluidics Channel

Figure 12:
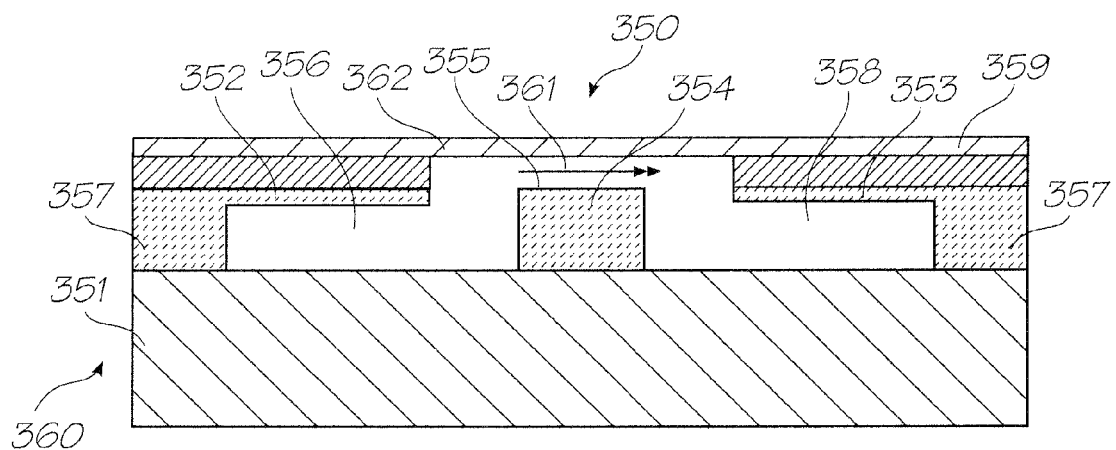
FIG. 12 shows a microfluidic diaphragm valve in an open position.
Figure 13:
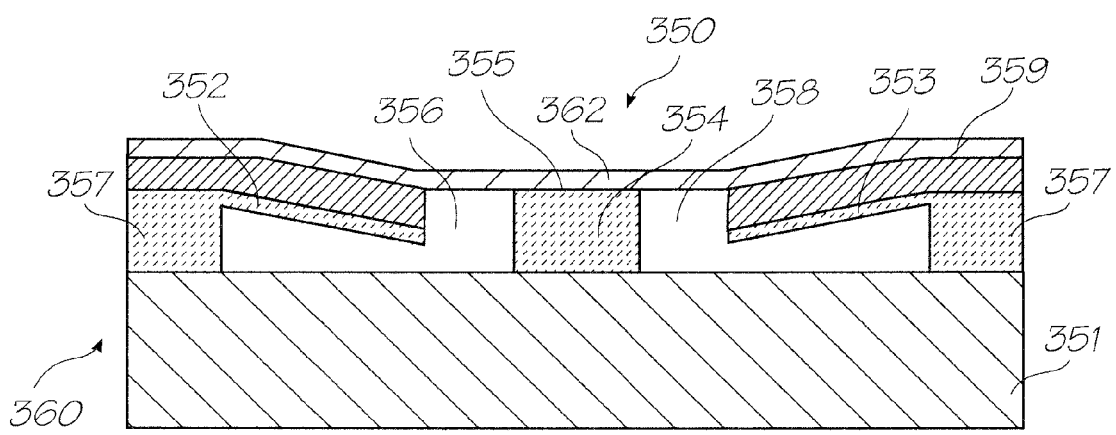
FIG. 13 shows the microfluidic diaphragm valve of FIG. 12 in a closed position.

Referring to FIGS. 12 and 13, there is shown a microfluidics diaphragm-type valve 350 formed on a CMOS silicon substrate 351. The valve 350 is entirely self-contained in a MEMS integrated circuit 360. Thus, the valve 350 potentially obviates the need for bonding the MEMS integrated circuit 360 to a microfluidics platform altogether, since the MEMS integrated circuit can contain all the control circuitry, microchannels, valves and pumps required to create a complete LOC device or μTAS. The valve 350 paves the way for LOC devices constructed entirely using silicon-based MEMS technology, as opposed to soft lithography, which has now become standard in the art.

Alternatively, the MEMS integrated circuit 360 may still be bonded to a microfluidics platform, as described above. It will be appreciated that microchannels in a microfluidics platform may be connected to fluid outlets (not shown) in the MEMS integrated circuit 360 to create a LOC device.

Turning now to FIGS. 12 and 13, the valve 350 comprises a pair of opposed first and second actuation fingers 352 and 353, which both point towards a central saddle or weir 354 having a sealing face 355. The weir 354 is essentially a block of silicon oxide, which may be defined at the same time as sidewalls 357 of the valve 350 are defined during MEMS fabrication. It will be appreciated that each finger 352 and 353 is similar in design to the fingers 220 described above.

The weir 354 divides the valve 350 into an inlet port 356 and an outlet port 358. A layer of PDMS 359 bridges between the first and second actuation fingers 352 and 353 to form a roof 362, which acts as a diaphragm membrane for the valve 350.

As shown in FIG. 12, the inlet port 356 fluidically communicates with the outlet port 358 via a connecting channel 361, which is defined between the sealing face 355 of the weir 354 and the roof 362. In FIG. 13, each of the fingers 352 and 353 is actuated and bends downwards towards the silicon substrate 351. This bending of the fingers 352 and 353, in turn, pulls the roof 362 into sealing engagement with the sealing face 355 of the weir 354. This sealing engagement between the roof 362 and the sealing face 355 prevents any fluid flowing from the inlet port 356 to the outlet port 358 (and vice versa). Hence, the valve 350 is closed as shown in FIG. 13.

Subsequent deactuation of the fingers 352 and 353 releases the roof 362 from sealing engagement with the sealing face 355 as the fingers return to their quiescent state shown in FIG. 12.

Hence, a highly effective diaphragm valve 350 is provided, which makes use of a PDMS covering to provide a sealing diaphragm membrane for the valve. By using PDMS in this way, an effective valve can be made for microfluidic channels defined in rigid materials, such as a silicon-based MEMS integrated circuit. It will be appreciated that such a valve may be used in a variety of microfluidic systems, such as LOC devices.

It will, of course, be appreciated that the present invention has been described purely by way of example and that modifications of detail may be made within the scope of the invention, which is defined by the accompanying claims.

The invention claimed is:

1. A MEMS integrated circuit comprising one or more peristaltic microfluidic pumps and control circuitry for said one or more pumps, each pump comprising:
   a pumping chamber positioned between an inlet and an outlet;
   a plurality of moveable fingers positioned in a wall of said pumping chamber, said fingers being arranged in a row along said wall; and
   a plurality of thermal bend actuators, each actuator being associated with a respective finger such that actuation of said thermal bend actuator causes movement of said respective finger into said pumping chamber,
wherein said control circuitry controls actuation of said plurality of actuators, and said control circuitry is configured to provide a peristaltic pumping action in each pumping chamber via peristaltic movement of said fingers.

2. The MEMS integrated circuit of claim 1, wherein the pumping chamber is elongate, and said fingers are arranged in a row along a longitudinal wall of said pumping chamber.

3. The MEMS integrated circuit of claim 2, wherein each finger extends transversely across said chamber.

4. The MEMS integrated circuit of claim 3, wherein said fingers are arranged in opposed pairs of fingers, each finger in an opposed pair pointing towards a central longitudinal axis of said pumping chamber.

5. The MEMS integrated circuit of claim 1, wherein each finger comprises said thermal bend actuator.

6. The MEMS integrated circuit of claim 1, wherein said pumping chamber comprises a roof spaced apart from a substrate, and sidewalls extending between said roof and a floor defined by said substrate.

7. The MEMS integrated circuit of claim 6, wherein said fingers are positioned in said roof.

8. The MEMS integrated circuit of claim 1, wherein each thermal bend actuator comprises:
   an active beam comprised of a thermoelastic material; and
   a passive beam mechanically cooperating with said active beam, such that when a current is passed through the active beam, the active beam heats and expands relative to the passive beam, resulting in bending of the actuator.

9. The MEMS integrated circuit of claim 8, wherein an extent of each finger is defined by said passive beam.

10. The MEMS integrated circuit of claim 8, wherein said active beam is fused to said passive beam.

11. The MEMS integrated circuit of claim 8, wherein said active beam defines a bent current path extending between a pair of electrodes, said electrodes being connected to said control circuitry.

12. The MEMS integrated circuit of claim 6, wherein said thermoelastic material is selected from the group comprising: titanium nitride, titanium aluminium nitride and vanadium-aluminium alloys.

13. The MEMS integrated circuit of claim 6, wherein said passive beam is comprised of a material selected from the group comprising: silicon oxide, silicon nitride and silicon oxynitride.

14. The MEMS integrated circuit of claim 6, wherein said substrate is a silicon substrate having said control circuitry contained in at least one CMOS layer thereof.

15. The MEMS integrated circuit of claim 1, wherein said wall is covered with a polymeric layer, said polymeric layer providing a mechanical seal between each finger and said wall.

16. The MEMS integrated circuit of claim 15, wherein said polymeric layer is comprised of polydimethylsiloxane (PDMS).

17. The MEMS integrated circuit of claim 15, wherein said polymeric layer defines an exterior surface of said MEMS integrated circuit.

18. The MEMS integrated circuit of claim 17, wherein said outlet is defined in said exterior surface.

19. The MEMS integrated circuit of claim 6, wherein said inlet is defined in said substrate.

20. A microfluidic system comprising a MEMS integrated circuit, said MEMS integrated circuit comprising one or more peristaltic microfluidic pumps and control circuitry for said one or more pumps, each pump comprising:
   a pumping chamber positioned between an inlet and an outlet;

a plurality of moveable fingers positioned in a wall of said pumping chamber, said fingers being arranged in a row along said wall; and a plurality of thermal bend actuators, each actuator being associated with a respective finger such that actuation of said thermal bend actuator causes movement of said respective finger into said pumping chamber, wherein said control circuitry controls actuation of said plurality of actuators, and said control circuitry is configured to provide a peristaltic pumping action in each pumping chamber via peristaltic movement of said fingers.

* * * * *